(12) United States Patent
Hardin et al.

(10) Patent No.: US 6,658,043 B2
(45) Date of Patent: Dec. 2, 2003

(54) METHOD AND APPARATUS FOR PROVIDING MULTIPLE SPREAD SPECTRUM CLOCK GENERATOR CIRCUITS WITH OVERLAPPING OUTPUT FREQUENCIES

(75) Inventors: Keith Bryan Hardin, Lexington, KY (US); Robert Aaron Oglesbee, Lexington, KY (US); Brian Keith Owens, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 190 days.

(21) Appl. No.: 10/004,734

(22) Filed: Oct. 26, 2001

(65) Prior Publication Data

US 2003/0081653 A1 May 1, 2003

(51) Int. Cl.[7] .......................... H04B 15/00; H04K 1/00; H04L 27/30
(52) U.S. Cl. ........................................ 375/130; 375/135
(58) Field of Search ................................. 375/130, 135, 375/346, 296, 295; 331/2

(56) References Cited

U.S. PATENT DOCUMENTS

| | | | |
|---|---|---|---|
| 4,507,796 A | 3/1985 | Stumfall ..................... 375/376 |
| 4,695,808 A | 9/1987 | Cabaniss et al. ............. 331/517 |
| 4,831,338 A | 5/1989 | Yamaguchi ................. 331/1 A |
| 4,965,533 A | 10/1990 | Gilmore ....................... 331/18 |
| 5,003,553 A | 3/1991 | Schluge et al. ............. 375/130 |
| 5,028,887 A | 7/1991 | Gilmore ..................... 331/1 A |
| 5,055,800 A | 10/1991 | Black et al. ................ 331/1 A |
| 5,059,924 A | 10/1991 | JenningsCheck ............ 331/1 A |
| 5,079,519 A | 1/1992 | Ashby et al. ................ 331/1 A |
| 5,130,671 A | 7/1992 | Shahriary et al. ............. 331/16 |
| 5,180,993 A | 1/1993 | Dent ............................ 331/16 |
| 5,263,055 A | * 11/1993 | Cahill ........................ 375/346 |
| 5,317,207 A | * 5/1994 | Mortensen .................. 307/443 |
| 5,329,253 A | * 7/1994 | Ichihara ....................... 331/17 |
| 5,347,233 A | * 9/1994 | Ishibashi et al. ............... 331/2 |
| 5,375,148 A | * 12/1994 | Parker et al. ............... 375/376 |
| 5,477,330 A | * 12/1995 | Dorr .......................... 358/296 |
| 5,481,573 A | * 1/1996 | Jacobowitz et al. ........ 375/356 |
| 5,488,627 A | * 1/1996 | Hardin et al. ............... 375/139 |
| 5,491,458 A | * 2/1996 | McCune, Jr. et al. ........ 332/144 |
| 5,493,700 A | * 2/1996 | Hietala et al. ................ 455/75 |
| 5,495,206 A | * 2/1996 | Hietala ........................ 331/1 A |
| 5,495,505 A | * 2/1996 | Kundmann ................. 375/308 |
| 5,508,659 A | 4/1996 | Brunet et al. .................. 331/16 |
| 5,534,805 A | 7/1996 | Miyazaki et al. ........... 327/144 |
| 5,565,816 A | 10/1996 | Coteus .......................... 331/2 |
| 5,574,407 A | 11/1996 | Sauer et al. .................. 331/14 |

(List continued on next page.)

Primary Examiner—Mohammad H. Ghayour
(74) Attorney, Agent, or Firm—Frederick H. Gribbell; John A. Brady

(57) ABSTRACT

A multiple output spread spectrum clock circuit is provided that reduces electromagnetic emissions when two different clocks operate at frequencies which overlap one another. Two such clock circuits are controlled so as to introduce a phase difference between the clocks as they operate through their spread spectrum profiles. The "best" phase differences are around 18%, or around 50%, between adjacent spread spectrum clock outputs. The phase difference can be controlled by starting the first clock (SSCG #1) at one point in time, while temporarily delaying the start of the second clock (SSCG #2) until the appropriate moment; alternatively, it can be controlled by starting both clocks at the same moment in time, however, SSCG #1 begins at one point in the spread spectrum profile, while SSCG #2 begins at a different point in its spread spectrum profile.

22 Claims, 14 Drawing Sheets

U.S. PATENT DOCUMENTS

| | | | | |
|---|---|---|---|---|
| 5,576,666 | A | 11/1996 | Rauvola | 331/25 |
| 5,610,651 | A | 3/1997 | Yamakawa et al. | 347/250 |
| 5,610,955 | A | 3/1997 | Bland | 375/376 |
| 5,623,649 | A * | 4/1997 | Verdun | 395/558 |
| 5,631,587 | A | 5/1997 | Co et al. | 327/107 |
| 5,631,920 | A | 5/1997 | Hardin | 375/130 |
| 5,651,035 | A | 7/1997 | Tozun et al. | 375/373 |
| 5,659,339 | A | 8/1997 | Rindal et al. | 345/212 |
| 5,659,587 | A | 8/1997 | Knierim | 375/376 |
| 5,663,991 | A | 9/1997 | Kelkar et al. | 375/376 |
| 5,694,089 | A | 12/1997 | Adachi et al. | 331/16 |
| 5,701,598 | A | 12/1997 | Atkinson | 455/161.2 |
| 5,710,524 | A | 1/1998 | Chou et al. | 331/1 A |
| 5,714,896 | A | 2/1998 | Nakagawa et al. | 327/115 |
| 5,719,510 | A | 2/1998 | Weidner | 327/119 |
| 5,724,007 | A | 3/1998 | Mar | 331/1 A |
| 5,731,728 | A | 3/1998 | Greiss | 327/299 |
| 5,736,893 | A | 4/1998 | Puckette et al. | 327/551 |
| 5,737,356 | A | 4/1998 | Harrison et al. | |
| 5,757,239 | A | 5/1998 | Gilmore | 331/18 |
| 5,757,338 | A | 5/1998 | Bassaetti et al. | 345/3.2 |
| 5,760,637 | A | 6/1998 | Wong et al. | 327/536 |
| 5,764,711 | A | 6/1998 | Jokura | 375/376 |
| 5,771,264 | A | 6/1998 | Lane | 375/376 |
| 5,777,521 | A | 7/1998 | Gillig et al. | 331/16 |
| 5,796,392 | A | 8/1998 | Eglit | 345/213 |
| 5,831,483 | A | 11/1998 | Fukuda | 331/19 |
| 5,867,524 | A | 2/1999 | Booth et al. | 375/130 |
| 5,872,807 | A | 2/1999 | Booth et al. | 375/130 |
| 5,889,819 | A | 3/1999 | Arnett | 375/270 |
| 5,909,144 | A | 6/1999 | Puckette et al. | 327/551 |
| 5,909,472 | A | 6/1999 | Arnett | 375/362 |
| 5,940,428 | A | 8/1999 | Ishiguro et al. | 375/150 |
| 5,943,382 | A | 8/1999 | Li et al. | 375/376 |
| 5,963,604 | A | 10/1999 | Greiss | 375/355 |
| 6,006,008 | A | 12/1999 | Klaffenbach et al. | 388/813 |
| 6,014,063 | A | 1/2000 | Liu et al. | 331/78 |
| 6,020,939 | A | 2/2000 | Rindal et al. | 348/805 |
| 6,046,646 | A | 4/2000 | Lo et al. | 331/10 |
| 6,046,735 | A * | 4/2000 | Bassetti et al. | 345/204 |
| 6,114,915 | A | 9/2000 | Huang et al. | 331/25 |
| 6,133,770 | A | 10/2000 | Hasegawa | 327/156 |
| 6,144,242 | A | 11/2000 | Jeong et al. | 327/269 |
| 6,147,699 | A * | 11/2000 | Berry et al. | 347/255 |
| 6,167,103 | A | 12/2000 | Hardin | 375/376 |
| 6,175,259 | B1 | 1/2001 | Mann et al. | 327/159 |
| 6,198,353 | B1 | 3/2001 | Janesch et al. | 331/16 |
| 6,240,123 | B1 | 5/2001 | Zhang et al. | |
| 6,292,507 | B1 | 9/2001 | Hardin et al. | 375/130 |

* cited by examiner

METHOD AND APPARATUS FOR PROVIDING MULTIPLE SPREAD SPECTRUM CLOCK GENERATOR CIRCUITS WITH OVERLAPPING OUTPUT FREQUENCIES

TECHNICAL FIELD

The present invention relates generally to spread spectrum clock generators and is particularly directed to multiple spread spectrum clock generators of the type which exhibit overlapping output frequencies. The invention is specifically disclosed as a multiple output spread spectrum clock generator circuit that is mounted on a single substrate, in which the electromagnetic emissions are somewhat reduced by introducing and controlling a phase difference between operating frequencies of the multiple clock outputs, even though these operating frequencies overlap one another.

BACKGROUND OF THE INVENTION

In typical clock generation circuits, emissions from multiple independent sources will add together at each frequency. This is true for spread spectrum clock generator sources as well. This will cause higher emission levels that are regulated by the FCC and other regulating bodies, thereby causing additional product costs to comply with these regulations. In situations where two spread spectrum clock generators are operating at the same average frequency and have the same spread spectrum profile, the two sources that are aligned in phase will typically double the output emissions, for a +6 dB increase in those emissions.

It would be an advantage to design a circuit that can supply two different spread spectrum clock generators from a single fixed-frequency source in which the overall emissions are not doubled, but instead are greatly reduced from that typical doubling effect.

SUMMARY OF THE INVENTION

Accordingly, it is an advantage of the present invention to provide two spread spectrum clock generator circuits that can operate from a single fixed-frequency source, but do not double their overall emissions when operating in an overlapping frequency situation. it would be another advantage of the present invention to provide two separate SSCG sources that can completely overlap in frequency spectrum, and even have the same spread spectrum profile, while nevertheless reducing their combined emissions to a level that is barely above the emissions of a single spread spectrum clock generator source.

Additional advantages and other novel features of the invention will be set forth in part in the description that follows and in part will become apparent to those skilled in the art upon examination of the following or may be learned with the practice of the invention.

To achieve the foregoing and other advantages, and in accordance with one aspect of the present invention, a method for controlling a plurality of spread spectrum clock generator circuits is provided, including the following steps: (1) providing a first spread spectrum clock generator circuit and a second spread spectrum clock generator circuit, and providing a synchronization control logic circuit; (2) controlling the first spread spectrum clock generator circuit so that it outputs a first predetermined plurality of frequencies over a first predetermined time period, as according to a first predetermined spread spectrum profile; (3) controlling the second spread spectrum clock generator circuit so that it outputs a second predetermined plurality of frequencies over a second predetermined time period, as according to a second predetermined spread spectrum profile; and (4) further controlling the second spread spectrum clock generator circuit so that its second predetermined plurality of frequencies at least partially overlaps the first predetermined plurality of frequencies of the first spread spectrum clock generator circuit, while at the same time controlling a frequency difference between the outputs of both the first and second spread spectrum clock generator circuits so that an overall increase in electromagnetic emissions due to a combination of the first and second spread spectrum clock generator circuits is less than 6 dB above the electromagnetic emissions due solely to the first spread spectrum clock generator circuit.

In accordance with another aspect of the present invention, a multiple output spread spectrum clock generator circuit is provided, which comprises a first spread spectrum clock generator circuit and a second spread spectrum clock generator circuit; the first spread spectrum clock generator circuit outputs a first predetermined plurality of frequencies over a first predetermined time period, as according to a first predetermined spread spectrum profile; the second spread spectrum clock generator circuit outputs a second predetermined plurality of frequencies over a second predetermined time period, as according to a second predetermined spread spectrum profile, wherein the second predetermined plurality of frequencies of the second spread spectrum clock generator circuit at least partially overlaps the first predetermined plurality of frequencies of the first spread spectrum clock generator circuit; and a synchronization control logic circuit which controls in real time a frequency difference between the outputs of both the first and second spread spectrum clock generator circuits so that an overall increase in electromagnetic emissions due to a combination of the first and second spread spectrum clock generator circuits is less than 6 dB above the electromagnetic emissions due solely to the first spread spectrum clock generator circuit.

In accordance with a further aspect of the present invention, a multiple output spread spectrum clock generator circuit is provided, which comprises a first spread spectrum clock generator circuit, and a second spread spectrum clock generator circuit; the first spread spectrum clock generator circuit outputs a first predetermined plurality of frequencies over a first predetermined time period, as according to a first predetermined spread spectrum profile; the second spread spectrum clock generator circuit outputs a second predetermined plurality of frequencies over a second predetermined time period, as according to a second predetermined spread spectrum profile, wherein the second predetermined plurality of frequencies of the second spread spectrum clock generator circuit at least partially overlaps the first predetermined plurality of frequencies of the first spread spectrum clock generator circuit; and wherein the first spread spectrum clock generator circuit comprises a frequency synthesizer circuit, the second spread spectrum clock generator circuit comprises a programmable delay chain circuit and a tracking phase locked loop circuit, and the programmable delay chain circuit provides a temporal difference in real time between the outputs of both the first and second spread spectrum clock generator circuits so that an overall increase in electromagnetic emissions due to a combination of the first and second spread spectrum clock generator circuits is less than 6 dB above the electromagnetic emissions due solely to the first spread spectrum clock generator circuit.

Still other advantages of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Figure 1:
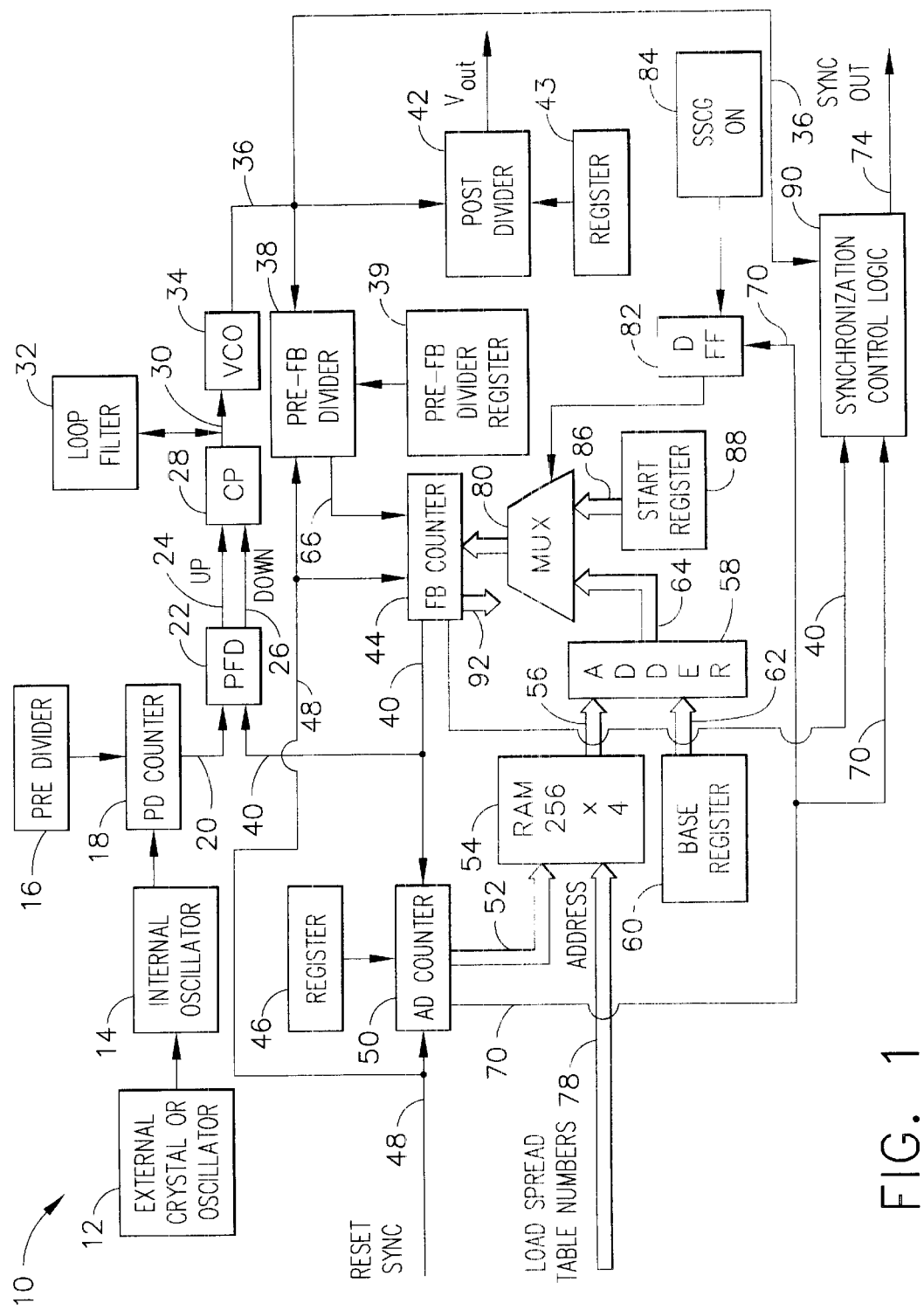
FIG. 1 is a block diagram of a spread spectrum clock generator circuit that includes a synchronization control logic circuit for driving a second SSCG source, constructed according to the principles of the present invention.

Reference will now be made in detail to the present preferred embodiment of the invention, an example of which is illustrated in the accompanying drawings, wherein like numerals indicate the same elements throughout the views.

Multiple spread spectrum clock generators in close proximity to one another typically do not overlap their operating frequencies if possible, to avoid additive emissions that will likely add cost to the overall product. In the present invention, two or more spread spectrum clock generators with overlapping operating frequencies are controlled in a manner which reduces the otherwise additive emissions, even if the operating frequencies totally overlap. This is accomplished by introducing and controlling a profile phase difference between the multiple clocks as they operate through their spread spectrum profile.

However, it is not simply a matter of introducing just any amount of profile phase difference between clock outputs-the inventors have determined that the "best" phase difference is around 18%, or around 50% of the profiles between adjacent spread spectrum clock outputs. If three spread spectrum clocks are required, then the preferred circuit would operate the second clock at a lagging phase difference of substantially 18% from the first clock, and the third clock at a lagging phase difference of substantially 18% from the second clock. In this example, the third clock would operate at a phase difference of about 36% behind the first clock; however, these first and third clocks would preferably be located apart from one another by the greatest possible physical distance within the circuit, while the first and second clocks as a pair could be physically located nearer to one another (and while the second and third clocks as a pair could similarly be located nearer). In the case of three spread spectrum clocks, the combined emissions would be reduced to less than an additional 9.5 dB above the emissions generated solely by a single clock.

It will be understood that phase differences other than the preferred values of 18% or 50% will achieve some reduction in overall emissions, but will likely produce combined emissions that are less beneficial than circuit configurations that operate at or near the preferred phase differences between spread spectrum clocks. In other words, an optimal reduction in combined emissions is less likely when using other phase differences than these preferred values; however, there will nevertheless be some benefit by using the principles of the present invention with multiple spread spectrum clocks.

At the present time, the inventors have found two main methodologies for introducing in real time the desired phase difference in the profiles between two spread spectrum clocks. Both methods use a similar circuit, as disclosed below, which includes a frequency synthesizer circuit in the form of a phase locked loop (PLL). The PLL includes a Feedback Counter, an Address Counter, a memory device that stores the "spread table" numbers (which typically is a RAM chip), and a bus that feeds the spread table numbers back to the Feedback Counter to cause the PLL to vary its output frequencies over a predetermined spread spectrum profile that is repetitive over a profile time period.

The first method of controlling the phase difference is to start the first spread spectrum clock generator (SSCG #1) at one point in time, while temporarily delaying the start of the second spread spectrum clock generator (SSCG #2). After a suitable time delay (which could represent either about 18% or 50% of the profile time period), the SSCG #2 is started. If the profile time periods of both SSCG #1 and SSCG #2 are identical, then these two clock circuits will indefinitely remain at the initial phase difference due to this temporal shift. If the profile time periods of SSCG #1 and SSCG #2 are not identical, then the appropriate time delay can be re-introduced at the beginning of each cycle of the spread spectrum profile of SSCG #2.

The second method of controlling the phase difference is to start both spread spectrum clocks at the same moment in time; however, SSCG #1 begins at one point in its spread spectrum profile, while SSCG #2 begins at a different point in its spread spectrum profile. Of course, this difference in the profiles will be controlled so as to effectively keep the two clocks apart in profile phase, preferably by either 18% or 50%. As in the first method discussed above, if the profile time periods of both SSCG #1 and SSCG #2 are identical, then these two clock circuits will indefinitely remain at the initial phase difference. Alternatively, if the profile time periods of SSCG #1 and SSCG #2 are not identical, then the appropriate starting point can be re-introduced at the beginning of each cycle of the spread spectrum profile of SSCG #2. It should be noted that the 18% phase difference between two clock circuits can be either leading or lagging. In other words, 18% leading may also be considered as 82% lagging, and the beneficial effects on reduced emissions are nevertheless obtained.

The two above methods can be implemented in many ways, several of which are disclosed below. In general, the phase difference between two spread spectrum clocks is controlled by a "synchronization control logic" circuit. Examples of this type of circuit are provided, which include decoder circuits that output a signal only upon receipt of a certain binary number output by the Address Counter or Feedback Counter of one of the spread spectrum clock circuits, or which include flip-flops and counters that use the "rollover" outputs (also known as the overflow bit or Carry bit) of the Address Counter and Feedback Counter. The various examples of logic provided below have the ultimate goal of outputting a "reset" signal that is sent to the second spread spectrum clock circuit, and this reset signal is used to restart the SSCG #2 to its initial profile conditions (either at a frequency point that is 18% different in the profile phase, or the reset signal occurs after a time delay representing an 18% difference in profile phase and restarts the SSCG #2 at its zero profile point).

Other refinements of the present invention are also provided, including a "fine tuning" control that more precisely controls the exact profile phase difference between two spread spectrum clock circuits. An example of such a fine tuning circuit uses a programmable delay chain with a multiplexer circuit, which outputs a reset signal.

Another refinement is a circuit that can "test" or "check" the actual synchronization in real time between two spread spectrum clock circuits. The output of this test or check circuit provides an indication as to whether or not the two clocks are actually synchronized by the expected (appropriate) amount, and if not, provides a way to reset the second clock circuit. This check circuit also uses decoder circuits that receive information from the Address Counters and Feedback Counters of both clock circuits, and can also refine the test by an optional programmable delay chain circuit.

A further refinement of the present invention is for two different spread spectrum clock circuits to share certain components, while maintaining the desired profile phase differential. Each clock requires its own phase locked loop kernel in the examples provided below, however, certain key counters and registers can be shared, thereby reducing component count. In the disclosed circuits, a multiport RAM device is used so that each clock circuit can independently access the spread table numbers as needed to program their individual Feedback Counters.

Yet another refinement of the present invention provides two spread spectrum clock outputs that are separated by an appropriate profile phase amount, however, in this circuit only one programmable phase locked loop is involved. In this embodiment, there is no synchronization control logic circuit. Instead, a programmable delay chain is provided that introduces an appropriate time delay to represent the profile phase difference, and the output of the delay chain is directed to a tracking phase locked loop circuit.

Referring now to the drawings, FIG. 1 depicts a spread spectrum clock generator circuit, generally depicted by the reference numeral 10, that is constructed according to the principles of the present invention for use in engineering applications where more than one such spread spectrum clock output is desired based upon a single constant frequency clock signal. One of the major portions of this circuit 10 is a Phase Locked Loop (PLL) that includes a Phase Frequency Detector (PFD) 22, a charge pump 28, a loop filter 32, a Voltage Control Oscillator (VCO) 34, and feedback circuitry at 38 and 44.

A reference signal at 20 is directed to an input of the PFD 22, which also has a second "feedback" input at 40. PFD 22 outputs two signals called UP and DOWN, respectively at the reference numerals 24 and 26, which are connected to the input of charge pump 28. The charge pump current is an output at 30 that is directed to a loop filter 32 that conditions the signal before sending it on to the VCO 34. The output of VCO 34 is a frequency signal that is proportional to the output voltage of the charge pump at 30. The output 36 of VCO 34 is directed to a pre-feedback divide-by-N circuit 38, which is also called "pre-feedback divider" (which essentially is a counter circuit), and which will output a pulse after receiving a cumulative total of N input pulses. A register 39 controls the value of N, and is referred to as the "pre-feedback divider register." Since the register is programmable, the value of N can be varied in real time (i.e., during operation of the clock circuit).

The output of the N counter 38 is directed at 66 to a Feedback Counter 44, which further divides the frequency by a variable amount that is controlled by other components to be described below. This divide amount is referred to herein as "M," and the value for M can also be varied in real time (i.e., during operation of the clock circuit). The output of Feedback Counter 44 (at 40) is directed to one of the inputs of the PFD 22 (as noted above) as the feedback signal 40, and also to an Address Counter 50. This arrangement provides very flexible control over the frequencies being sent through the PFD 22 and Feedback Counter 44.

A "Reset Sync" signal at 48 is directed to the Address Counter 50, the pre-feedback divider 38, and the Feedback Counter 44, and can be used to cause these counters to immediately start counting from zero at any time desired by the overall circuit logic. This provides further flexibility in maintaining operation of the clock circuit 10.

A very accurate external crystal or oscillator circuit is provided at 12 which produces a constant frequency output that can be modified by an internal oscillator at 14. Alternatively, the "external crystal" at 12 can represent a single crystal clock device as purchased from a manufacturer, and the "internal oscillator" at 14 can represent the support circuitry for the crystal itself at 12. The output from the "internal oscillator" at 14 is provided to a counter circuit at 18 (referred to as the "PD Counter") and may also be provided as a constant frequency reference output, if desired.

If the "internal oscillator" at 14 is provided as a separate frequency synthesizer circuit, such as another phase locked loop, then the external crystal at 12 can have a very wide range of frequencies, and the internal oscillator at 14 in that case could modify that crystal frequency to whatever fixed reference frequency is desired for a particular application.

The PD Counter 18 is capable of dividing the frequency by an integer. The value for the divisor "P" in counter 18 can be loaded from a register at 16, which is referred to on FIG. 1 as a pre-divider register. In this manner, the value for P in counter 18 can be made programmable.

If the value of N for the N counter 38 remains constant and the value of M for the Feedback Counter 44 remains constant, then the PLL circuit will behave as a standard fixed-frequency Phase Locked Loop. However, for use in the present invention, these value for N and M in counters 38 and 44 can be varied over time. As is known in the prior art, this variance of N and M can be controlled by some type of processing circuit (such as under control of a microprocessor) or a logic state machine, or it can be controlled by a hardware logic circuit that contains no central processing unit.

Certain auxiliary components that also affect the Feedback Counter 44 include a memory device (illustrated as a Random Access Memory (RAM) circuit) 54, a Base Register 60, and a Start Register 88. These components provide numeric values to the Feedback Counter 44 that control the spread spectrum profile that modulates the output frequency $V_{OUT}$. The RAM memory device 54 is loaded over a bus 52 with values from the Address Counter 50, and also can be loaded with address values directly from a microprocessor (or other logic) over an address bus at 78. Moreover, a control signal that is latched by a D flip-flop 82 causes the spread spectrum clock generator circuit to begin operation (and will then continue to operate).

The Address Counter 50 will preferably contain enough memory space for 256 bytes of numeric values, and provides those numeric values on its output bus 52 into the RAM device 54. This occurs under control of the count value that is output from the Feedback Counter 44. It is also under the control of a value that is input from a register 46. The numeric value that is loaded into register 46 represents the number of addresses that are to be used by the lookup table in the RAM device 54. Address Counter 50 will therefore count sequentially (and repeatedly) through the number of addresses that are used by the table within the RAM device 54, and this numeric value is set by register 46. Every time a pulse is emitted from the output of Feedback Counter 44, the Address Counter at 50 counts another incremental value and will then output a new numeric value on its output bus at 52 into the RAM table. This numeric value on bus 52 represents an address pointer that points into a specific memory location within the RAM device 54.

Another signal that affects the Address Counter 50 is a "Reset Sync" signal at 48. When this Reset Sync signal at 48 goes active, it will cause the Address Counter's output to be reset to its initial value. Typically, that initial value will be set to a count value of zero (0), however, the system architecture of FIG. 1 allows for the initial value to be any numeric value in the range 0–255 (assuming the Address Counter contains 256 address locations). This Reset Sync signal allows an upstream clock circuit to control the starting value and timing of the spread spectrum clock generator circuit 10 of FIG. 1. This is useful when multiple spread clock generator circuits are desired that are to be synchronized with one another, as described below. Moreover, the spread spectrum clock circuit 10 of FIG. 1 also includes a "Sync Out" signal at 74 that can be used to synchronize further downstream clock generator circuits, including additional spread spectrum clock generators (as described below), or virtually any other type of digital clock device.

Upon initialization of the spread spectrum clock generator circuit 10, the system microprocessor will provide an initial load of a numeric value (which could be a set of zeros (0's)) into the RAM device 54. Once a power-on reset sequence has successfully occurred, the microprocessor will then load the RAM 54 with a predetermined set of numbers that are associated with a particular desired frequency and deviation output. In the illustrated embodiment of FIG. 1, the RAM device 54 comprises a RAM circuit having 256 rows by 4 columns, which allows for 4-bit precision, and has 256 such values as a maximum. If desired, not all of the 256 memory locations need be utilized by the Address Counter 50 (as noted above).

It will be understood that other types of memory devices besides RAM could be utilized for the memory device 54 in the clock generator circuit 10 of FIG. 1. A ROM (Read Only Memory) could be used if it is definitely known that the numeric values in the table stored in the memory device 54 will never be changed for a particular application of this circuit 10. Moreover, a plurality of registers could be utilized, although they would have to be individually addressable by both the bus 78 and the bus 52 to be effective in the illustrated design of FIG. 1. In the case of a volatile memory device, such as RAM, other circuit components can be utilized to overcome certain shortcomings upon initialization of power of the circuit 10, such as the Start Register at 88. This will be discussed below in greater detail.

If the numbers that need to be stored in the look-up table of the RAM memory device 54 are large in magnitude and the amount that the numbers vary from one another are relatively small in magnitude, then a base number can be added to the stored values to keep the memory size small of the RAM memory device 54. This is the reason that a 4-bit precision device can be used. This is accomplished by use of the Base Register 60 which provides a numeric value via a bus 62 to an adder circuit 58. The output from the RAM memory device 54 is also presented via a bus 56 to the adder circuit 58, and the output of this adder circuit 58 is the numeric sum of the RAM-provided numeric value and the Base Register numeric value.

It will be understood that adder circuit 58 will not be necessary if a base number is not required to keep the size of the RAM memory device 54 within a reasonable constraint. Of course, a larger memory chip could be used to eliminate the Base Register 60, but that would typically cost more money, either as a separate device, or as part of an ASIC that could be used to contain much, if not all, of the circuitry illustrated on FIG. 1.

If the address look-up table within the memory device 54 comprises actual RAM that is volatile, the circuit will initially start with blank numbers, or other unknown or unreliable values. This is the circumstance where the Start Register 88 will preferably be included to provide a realistic numeric value into the Feedback Counter 44 upon initialization. This will allow the Feedback Counter 44 to provide reasonable control characteristics upon a power-on reset condition. The Start Register 88 provides a numeric value via a bus 86 to a multiplexer 80. Upon initialization, multiplexer 80 will preferably output values that are presented from this Start Register 88. Later, the multiplexer will output values that are provided from the adder circuit 58, which are also input to the multiplexer 80 via a bus 64. Once that occurs, the numeric values in the RAM look-up table within the memory device 54 will directly control the Feedback Counter 44.

An "SSCG ON" register at 84 can be provided (either as a register or as an input from some external signal) which is used to select between a fixed or modulated adder amount. When activated, it presents a logic signal to a D flip-flop 82, which has an output that selects the desired input to the multiplexer 80. Upon initialization, the multiplexer 80 will be commanded to pay attention to the Start Register 88 value instead of the value output from the adder 58.

As inferred above, if the address look-up table in the memory device 54 comprises ROM or some other type of non-volatile memory, then there will always be correct "real" numbers to work with, and the Start Register 88 will not be required. Moreover, in that situation the multiplexer 80 would also not be required. Naturally, various combinations of adder circuits and multiplexer circuits could be utilized in the spread spectrum clock generator circuit 10 without departing from the principles of the present invention.

In the preferred embodiment, the Start Register 88 sets the operating frequency of the PLL when it is not looping through the look-up table values in the RAM memory device 54.

The Base Register 60 provides a predetermined number associated with the look-up table values in the RAM memory device 54. It can be changed depending upon the desired frequency output deviation and base frequency values. In the preferred mode of the present invention, the look-up table comprises RAM having 4-bit elements that can store values between 0–15, decimal.

A post-divider circuit 42 has its value controlled by a register 43. This register 43 is loaded with a number associated with the desired output frequency.

The registers that are illustrated on FIG. 1 could be replaced by hard logic in situations where it is known that the registers' numeric value will never change for a particular electronic application. However, to make the spread spectrum clock generator circuit 10 as universally useful as possible, the registers are preferred over hard logic, and furthermore are directly addressable by a microprocessor or other type of state machine logic or sequential logic. In that way each of the registers can be provided with an appropriate numeric value for a specific application, yet the same hardware design can be used for multiple clock generator applications by use of appropriate numbers in the registers. In some circumstances, it may be desirable for the output clock frequency at the Clock Out signal $V_{OUT}$ to operate in a different frequency domain, and the registers can be used for changing the divider circuits or various counters, where appropriate. This could also be used in combination with loading different values into the look-up table of the memory device 54 where that memory device is changeable, such as in the case of RAM memory or a group of registers.

The Address Counter 50 will preferably have an additional output at 70 that is useful for two purposes. In one instance, this signal 70 is used as the clock input to the D flip-flop 82. In another instance, signal 70 is directed to a circuit referred to herein as the "Synchronization Control Logic" 90, which is used to provide the Sync Out signal 74 that can start or otherwise control a second spread spectrum clock generator circuit, as noted above. Address Counter 50 provides an output pulse on signal line 70 when the count value reaches zero (0) (or some other desired numeric value). A second input signal to the Synchronization Control Logic 90 is provided by the Feedback Counter 44; this is the signal line 40. On FIG. 1, a third input signal to the Synchronization Control Logic 90 is the output 36 of the VCO 34. This configuration is discussed below in greater detail in reference to FIG. 6.

Other signals can be provided to the Synchronization Control Logic 90, as needed for a particular circuit topography of the Synchronization Control Logic 90 itself. For example, a circuit depicted in FIG. 3 uses the Address Counter pointer information on bus 52; a circuit depicted in FIG. 4 uses only the output pulse 70 from the Address Counter 50; and a circuit depicted in FIG. 5 uses a count value output from the Feedback Counter 44, as well as the Address Counter pointer information on bus 52.

Figure 2:
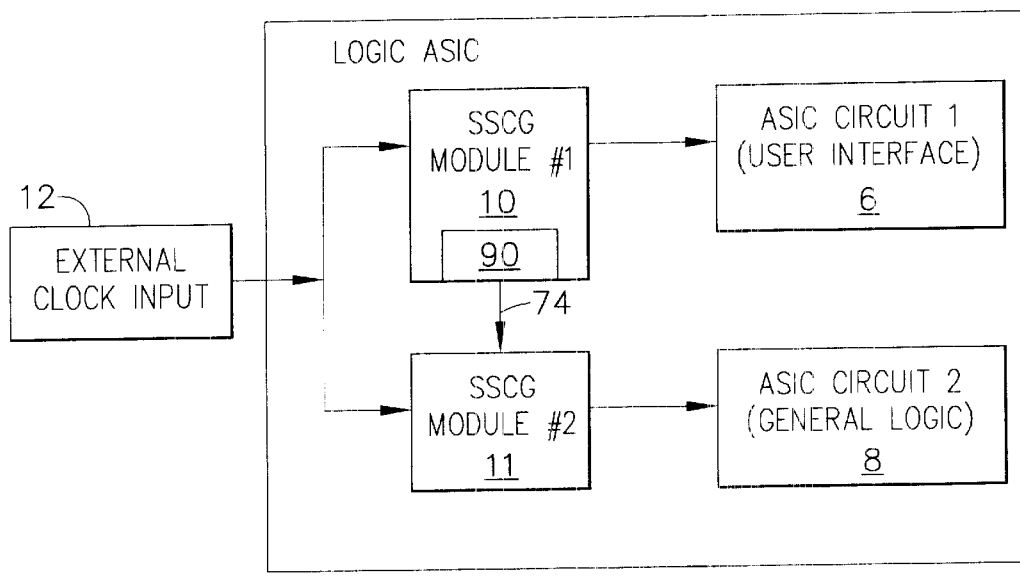
FIG. 2 is a block diagram of two separate SSCG modules that are constructed on a single logic ASIC, as according to the principles of the present invention.

FIG. 2 illustrates the present invention in a general block diagram circuit layout of two separate spread spectrum clock generator modules, designated by the reference numerals 10 and 11, respectively. Each of these two modules 10 and 11 drives a separate portion of an ASIC circuit, generally designated by the reference numerals 6 and 8, respectively. In this example of FIG. 2, the first ASIC circuit 6 represents a user interface, while the second ASIC circuit 8 represents general logic circuitry. Both ASIC circuits 6 and 8 reside on a single ASIC substrate.

Both of the spread spectrum clock generator modules 10 and 11 are driven by a common external clock input at 12. However, as according to the principles of the present invention, the two modules 10 and 11 do not operate at precisely the same frequencies at precisely the same moments in time. Even if the two modules 10 and 11 exhibit precisely the same spread spectrum profile and generate precisely the same plurality of frequencies (i.e., over the same frequency spectrum), the present invention reduces the overall electromagnetic emissions by causing a frequency or time difference between initial starting points of the spread spectrum profiles of these two modules. This frequency or time differential is controlled by the synchronization control logic 90, which outputs a Sync Out signal 74 in this example. In this simplified diagram, the Sync Out signal is used to start the second module 11 at a time or frequency difference that is predetermined by the synchronization control logic 90.

In a preferred mode of the present invention, the two SSCG modules 10 and 11 will both start at a certain frequency in their individual spread spectrum profiles, however, this starting point will be delayed in the second module 11 by a predetermined amount. In the preferred embodiments, this predetermined amount is either 18% or 50% of the period of the spread spectrum profile. Examples of such profiles are provided below, in reference to FIGS. 16 and 17. (Note, the 18% difference can be either leading or lagging.)

The synchronization control logic 90 can be designed in several different forms, and examples of some of these forms are provided on FIGS. 3–6. In some cases, the address value that is used in the RAM circuit 54 for the first module and a similar RAM circuit in the second module (not shown on FIG. 1) can both be started at the identical address, but at different times. Alternatively, two different addresses in the two different RAM modules can be used at the same time. In the examples depicted in FIGS. 3–6, it can generally be assumed that each of the spread spectrum clock generators 10 and 11 have their own independent hardware. However, other examples described below illustrate the fact that some of the components of the two different spread spectrum clock generators can be shared.

Figure 3:
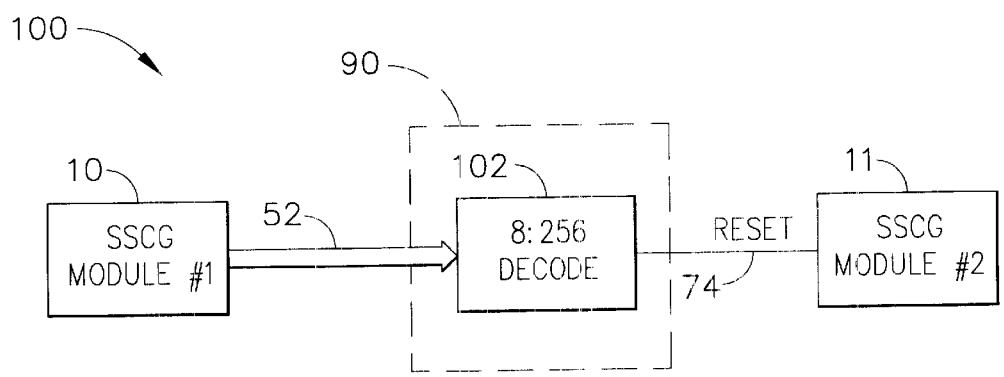
FIG. 3 is a block diagram of a first synchronization control logic circuit utilizable with FIG. 1.

Referring now to FIG. 3, the Address Counter address bus 52 is decoded by a decoder circuit 102. At a predetermined address, a reset signal on the Sync Out line 74 is generated and directed to the second SSCG module 11. The overall circuit is generally designated by the reference numeral 100. When the reset signal is generated, certain registers within the second or "slave" SSCG module 11 are reset, and specifically this would include the Address Counter value, the Feedback Counter value, and the pre-feedback divider value. This has the effect of synchronizing a predetermined initial address location within the slave SSCG profile with a predetermined address location of the master SSCG profile (for module 10).

Assume, for example, that both SSCG modules 10 and 11 have one hundred (100) different table values loaded in RAM (i.e., RAM 54 for the SSCG module 10) to generate the SSCG profiles. If it was desired for the slave module 11 to lag the master module 10 by 18%, then at a time when the Address Counter's counter address in the master module 10 becomes a desired value X, then a reset signal would be sent to the slave module 11. This would cause the counter address of the slave module's Address Counter to be set to "X−18 modulo 100." The corresponding Feedback Counter and pre-feedback divider values would also be loaded.

Figure 4:
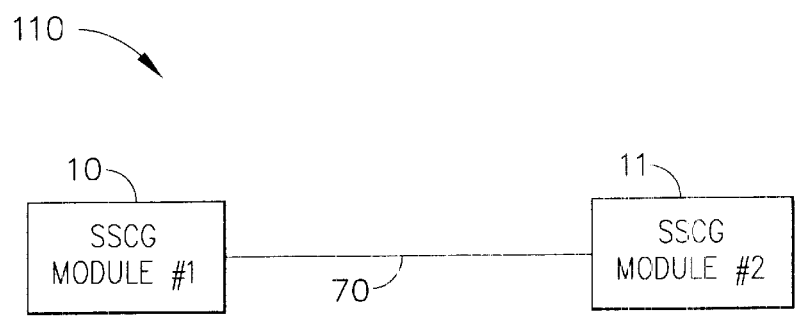
FIG. 4 is a block diagram of a second synchronization control logic circuit utilizable with FIG. 1.

This first method of synchronizing two spread spectrum clock generators provides coarse synchronization, however, it also provides a great flexibility of design. A more restricted subset is illustrated in FIG. 4, in which the rollover signal (or "Carry" bit) from the master module's Address Counter 50 is used directly as the signal sent to the second module 11. This rollover signal from the Address Counter 50 is the signal 70 on FIG. 1. The more simplified circuit of FIG. 4 is generally designated by the reference numeral 110.

In the circuit 110, the slave module 11 will be reset at the beginning of every master module's spread spectrum profile cycle. Therefore, the master module 10 will reset the slave module 11 when the Address Counter in the master module has its address roll over to all zeroes (0's). At this point, the slave module 11 will reset to an Address Counter value of either 17 or 81, along with associated feedback values (i.e., for the Feedback Counter and for the pre-feedback divider). This will start the two different Address Counters of the two different SSCG modules 10 and 11 at profile locations that are 18% apart from one another—in one case leading by 18%, and in the other case lagging by 18% (i.e., the difference between 81 and 99 address locations in the RAM 54). Of course, if the RAM 54 has a different number of addresses than one hundred (100), then a finer control may be necessary to achieve these percentage differences in the spread spectrum profile timings of the two modules 10 and 11. As an example, if the RAM table consists of 128 values instead of 100 values, then one could not obtain a precise 18% differential by an integer time interval difference when the precision is only one part in 128.

Figure 5:
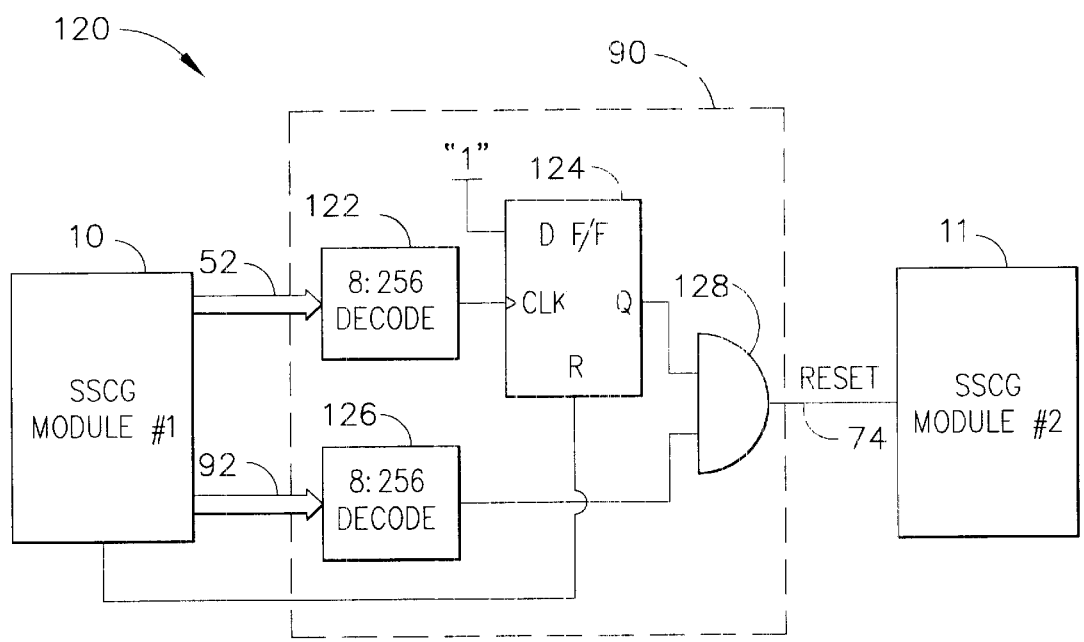
FIG. 5 is a block diagram of a third synchronization control logic circuit utilizable with FIG. 1.

Another alternative method for synchronizing two different SSCG modules is illustrated in FIG. 5, in which a circuit 120 utilizes both the Address Counter 50 and Feedback Counter 44 within the master SSCG module 10. The counter address bus 52 for the master's Address Counter 50 is decoded for a predetermined address location. This is accomplished by a decoder chip 122. In addition, the count value of the Feedback Counter 44 is also decoded to provide somewhat more fine control, in which the count value is presented along a data bus 92 to another decoder chip 126. When both the Address Counter count value on the address bus 52 and the Feedback Counter count value on the feedback count value bus 92 are correct, then a reset signal is output from an AND-gate 128, along the Sync Out line 74 to the second SSCG module 11. Since the Address Counter 50 and the Feedback Counter 44 run at different rates, it would be appropriate to use some type of latching flip-flop to "lengthen" one of the decode signals, in this case the decode signal that is used with the address bus 52 that comes from the decoder chip 122. In this instance, a D flip-flop 124 is provided to latch that signal until the feedback count value is correct.

The combination of the address bus value and feedback count value could be altered, and instead the Address Counter's address could be utilized with the overflow bit from the Feedback Counter 44, or the overflow bit from the Address Counter 50 could be used with the count value from the Feedback Counter along the bus 92. As in the previous examples, the appropriate values must be loaded into the slave module's Address Counter, Feedback Counter and pre-feedback divider.

Figure 6:
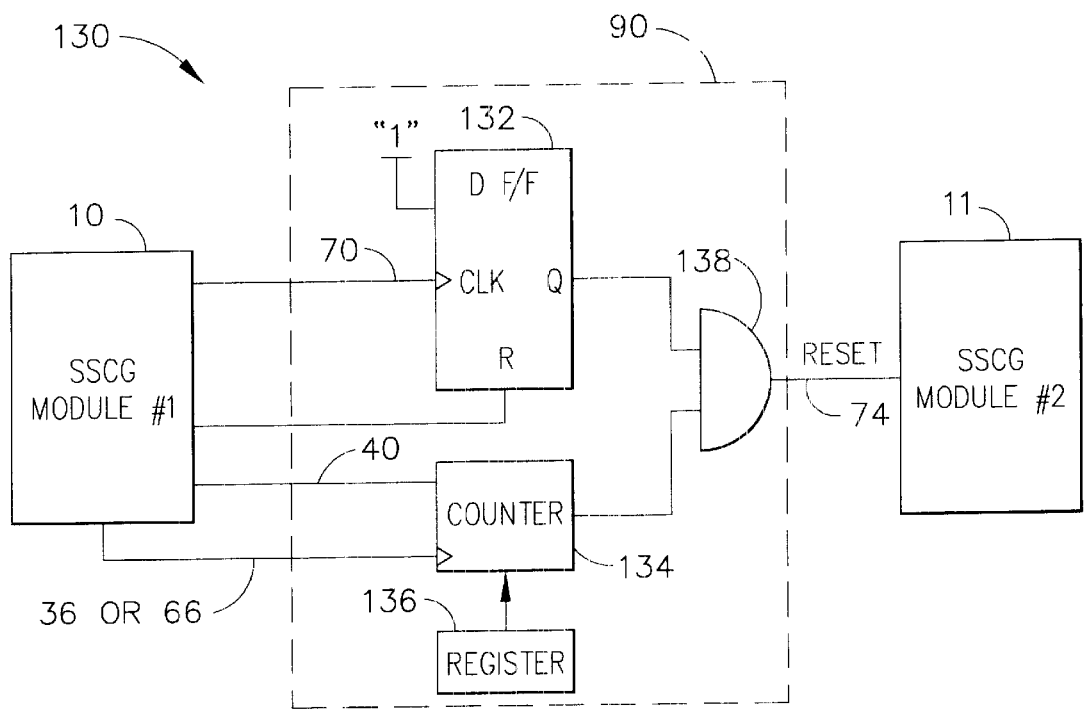
FIG. 6 is a block diagram of a fourth synchronization control logic circuit utilizable with FIG. 1.

An alternative subset of the design of circuit 120 is illustrated in FIG. 6, in which the Feedback Counter rollover signal (i.e., the overflow bit) is used to reset a counter that counts a certain number of VCO clock pulses before sending part of the reset signal. This is illustrated in FIG. 6 by the circuit 130. The Feedback Counter rollover signal is directed along the line 40 from the master module 10, and drives into a counter 134. In this alternative design, the Address Counter rollover signal at line 70 is latched by a D flip-flop 132, and the output of that signal and the output of the counter 134 are presented to an AND-gate 138. The output of AND-gate 138 is the reset signal along the Sync Out line 74 that drives the second SSCG module 11.

If the actual output frequency of the VCO 34 at the signal line 36 is not at an appropriate frequency, then the output from the pre-feedback divider 38 at signal line 66 could be instead used to drive the clock input of the counter 134. A register 136 can be used to load the counter 134 with a correct value for a specific spread spectrum profile. The register 136 is loaded with a number that represents the number of pulses from the VCO 34 that should be counted before allowing an output pulse from the counter 134. With regard to which signal to use for the clock input of the counter 134, it would typically be chosen depending on which of the signals at 36 or 66 had the higher frequency, which would provide the greater resolution.

One advantage of the implementations illustrated in FIGS. 5 and 6 is the benefit of placing the slave SSCG profile to a predetermined location with a resolution that is equal to the VCO clock.

Figure 7:
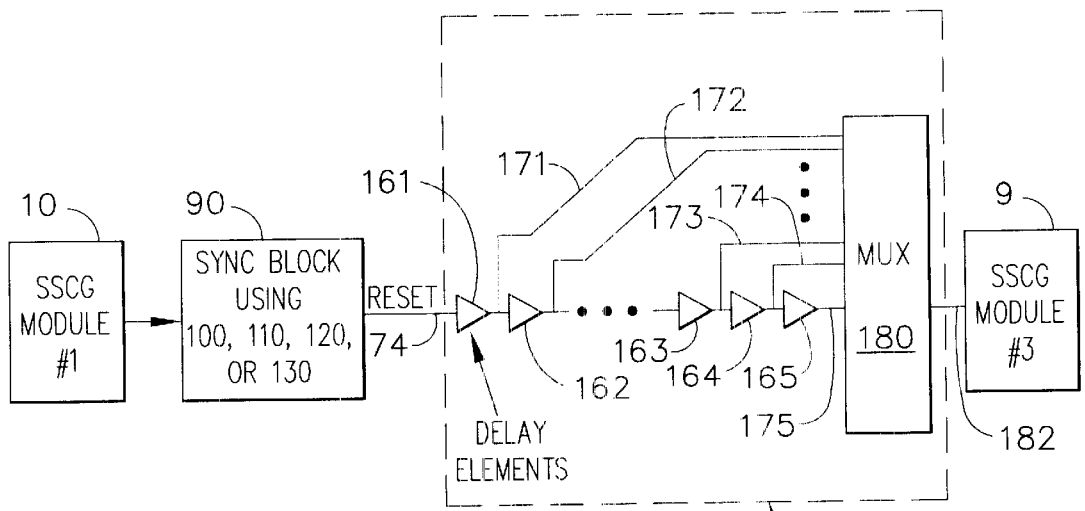
FIG. 7 is a block diagram of a more fine control for a synchronization control logic device that uses delay elements, utilizable with the present invention.

FIG. 7 illustrates a third method of synchronizing two different spread spectrum clock generator modules, in which the first clock module at 10 is similar to that depicted on FIG. 1. This utilizes a synchronization control logic 90 that could consist of any of the circuits depicted in FIGS. 3–6. Whichever circuit is used, a reset output at 74 is directed into a series of delay elements, such delay chain circuit being generally designated by the reference numeral 150.

The delay line (or chain) circuit 150 includes a series of individual delay elements at the reference numerals 161, 162, 163, 164, and 165. It will be understood that the number of delay elements is potentially near-infinite, depending upon how much time delay is desired to be introduced into the circuit. These delay elements provide a high precision of time slicing capability, for a relatively inexpensive cost. Such delay elements can typically be obtained in an ASIC-type circuit, in which the individual delays are created by the propagation delay of each element, which could be on the order of one nanosecond.

As can be seen in FIG. 7, the delay elements each have an output that is directed to a multiplexer chip 180. These output lines are represented at the reference numerals 171, 172, 173, 174, and 175. Of course, there would be as many output lines to the multiplexer 180 as there are delay elements in the circuit 150. The output of the multiplexer 180 is directed at the line 182 into a second spread spectrum clock generator circuit, referred to as SSCG #3 on FIG. 7, and designated by the reference numeral 9.

The multiplexer 180 can be programmed to select any one of the inputs at the lines 171–175, which in essence means that it can programmably select the appropriate cumulative delay output at one of the delay elements in the chain 150. This provides an even finer resolution with respect to how much time will be introduced between the reset signal at 74 and the actual reset input at 182 that is directed into the SSCG #3 module 9. Of course, this type of delay chain can be used in lieu of several other different types of circuits that introduce a programmable time delay, and perhaps could eliminate other elements of the synchronization control logic 90 that have been discussed above.

In a preferred embodiment, the delay elements would have individual delays that are each much less than the period of the VCO clock, which is the output signal at 36. The total delay time interval produced by the delay chain 150 preferably would be on the order of one VCO clock period.

Figure 8:
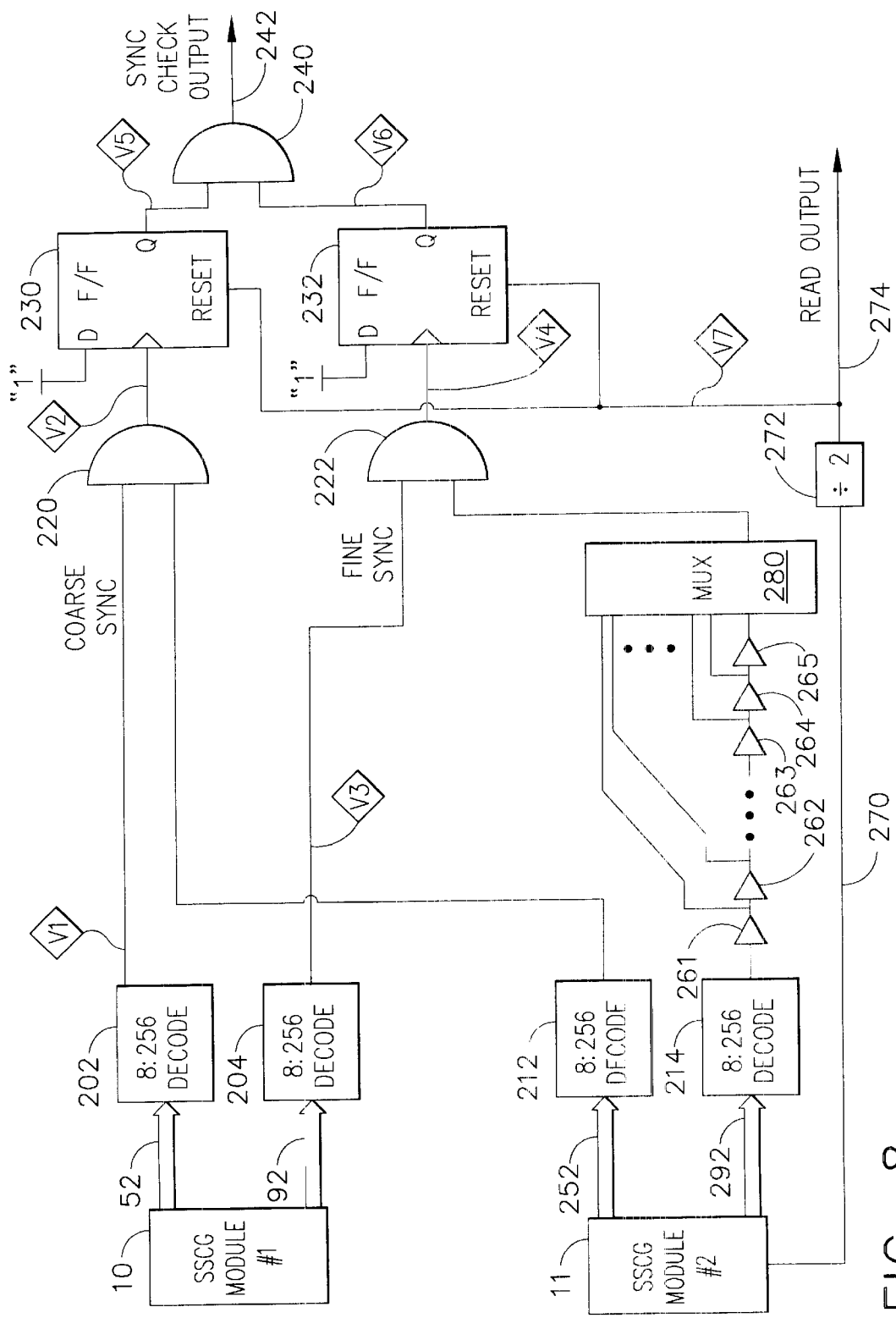
FIG. 8 is a block diagram of a synchronization checking circuit, utilizable with the present invention.

In addition to the types of synchronization circuits that have been discussed above, it is desired to have a methodology for checking the actual synchronization of the phase locked loops that are used in these spread spectrum clock generator modules. FIG. 8 depicts such a synchronization-checking circuit, and includes two SSCG modules at 10 and 11, each having an address count output bus 52 or 252 from their individual Address Counters, and each having a count value bus 92 or 292 from their individual Feedback Counters. A pair of decoder circuits at 202 and 204 are used to select a specific count value from the buses 52 and 92, respectively. Similarly, a pair of decoder circuits 212 and 214 are used to determine a specific count value at the buses 252 and 292, respectively.

The output of the decoder chip 202 is listed as a voltage value V1, whereas the output signal from the decoder chip 204 is listed as a voltage V3. The waveforms of these voltages are illustrated on FIG. 9. The outputs from the Address Counter buses for the two different SSCG modules are directed from the outputs of the decoder chips 202 and 212 to an AND-gate 220, which produces a "Coarse Sync" output signal that is represented by a voltage value V2. This part of the circuit compares the Address Counter individual addresses of the master and slave SSCG modules 10 and 11, which basically provides a relatively coarse synchronization check.

The outputs from the decoder chips 204 and 214 are ultimately directed to a different AND-gate 222, which has an output that represents a "Fine Sync" signal that is represented by a voltage value V4. The output from the decoder chip 204 is directed to the AND-gate 222 input directly, however, the output from the decoder chip 214 is (optionally) directed through a delay chain that includes a series of individual delay elements 261, 262, 263, 264, and 265, which have their outputs directed to a multiplexer 280. The output of this multiplexer is then directed to the input of the AND-gate 222. This delay chain is virtually identical to the delay chain circuit 150 that was discussed above in reference to FIG. 7.

This Fine Sync signal represents a much finer measurement that uses the Feedback Counter count values from the individual SSCG modules 10 and 11. If the master and slave modules 10 and 11 are correctly synchronized, the outputs of the AND-gates 220 and 222 will both output a Logic 1 at the appropriate time, which must be within a "synchronization window." Upon completion of the synchronization window interval, the controlling circuit (e.g., a microprocessor or a logic state machine) is instructed to read the outputs of the AND-gates, and immediately after that occurs, the synchronization circuitry is reset.

To latch the signals appropriately, a pair of D flip-flops are utilized to temporarily store the logic signals at V2 and V4, and these flip-flops are illustrated on FIG. 8 at 230 and 232, respectively. The outputs of flip-flops 230 and 232 are given the voltage designations V5 and V6, respectively, and are directed to another AND-gate 240. The output of this AND-gate 240 is a "synchronization-check" output, designated by the reference numeral 242. It is this signal 242 that is inspected by the controlling circuit to determine if the two SSCG modules are synchronized. If the controller reads a Logic 1, then the SSCG modules 10, 11 are correctly synchronized and no action is necessary. On the other hand, if the controller reads a Logic 0, then the slave SSCG module (i.e., module 11) is reset to bring it back into synchronization. However, the controller may perform multiple reads before performing this step. If desired for greater control flexibility, the controller processor could be used to inspect the individual synchronization lines instead of the output of the AND-gate 240, and compare these individual synchronization lines to expected values.

The synchronization test or check can be performed immediately after initialization, or at predetermined time intervals, if desired. Of course, the synchronization checking can be performed virtually continuously by using the synchronization check circuit of FIG. 8, and any time the SSCG modules are determined to be out-of-sync, the appropriate correction can be made. The reset function of the synchronization check circuit of FIG. 8 is performed by using the overflow line from the Address Counter of the second module 11, which is designated at 270 on FIG. 8. This overflow bit is directed to a divide-by-2 counter 272, which has a "Read Output" signal 274. This signal 274 is also designated as a voltage waveform V7, which is directed to the reset inputs of the D flip-flops 230 and 232.

It will be understood that the flip-flops 230 and 232 are optional, and would be used to lengthen the pulse width of the Coarse Sync and Fine Sync signals, at V2 and V4, only if necessary. It will further be understood that the delay chain elements 261–265 with multiplexer 280 might only be needed if a very fine synchronization were being achieved, typically by using a similar delay chain 150 in the actual synchronization reset signal circuit between the first and second SSCG modules (as shown in FIG. 7). Otherwise, the output from the decoder chip 214 could be directly sent to the input of the AND-gate 222.

If, for example, the maximum number of addresses in the Address Counter was 32, and the circuit designer desired to have an 18% time differential between the beginning of the spread spectrum profiles for the two SSCG modules 10 and 11, then the numeric count value would be approximately 5.76 counts out of 32. If the Feedback Counters do not run at a sufficiently fine resolution to achieve the 76/100 portion of the integer count necessary to achieve the 18% profile differential, then the delay chain 150 would be desired, as depicted in FIG. 7. By use of the delay chain, the circuit could be synchronized easily within the tolerance of 0.01% of the integer counts used in generating spread spectrum profiles. In one exemplary circuit, there are 40 feedback counter increments per each Address Counter increment, which gives a one part in forty address cycle resolution. This, of course, is still not sufficient to achieve a synchronization within one hundredth of a percent of the address count used in the spread spectrum profile period.

Figure 9:
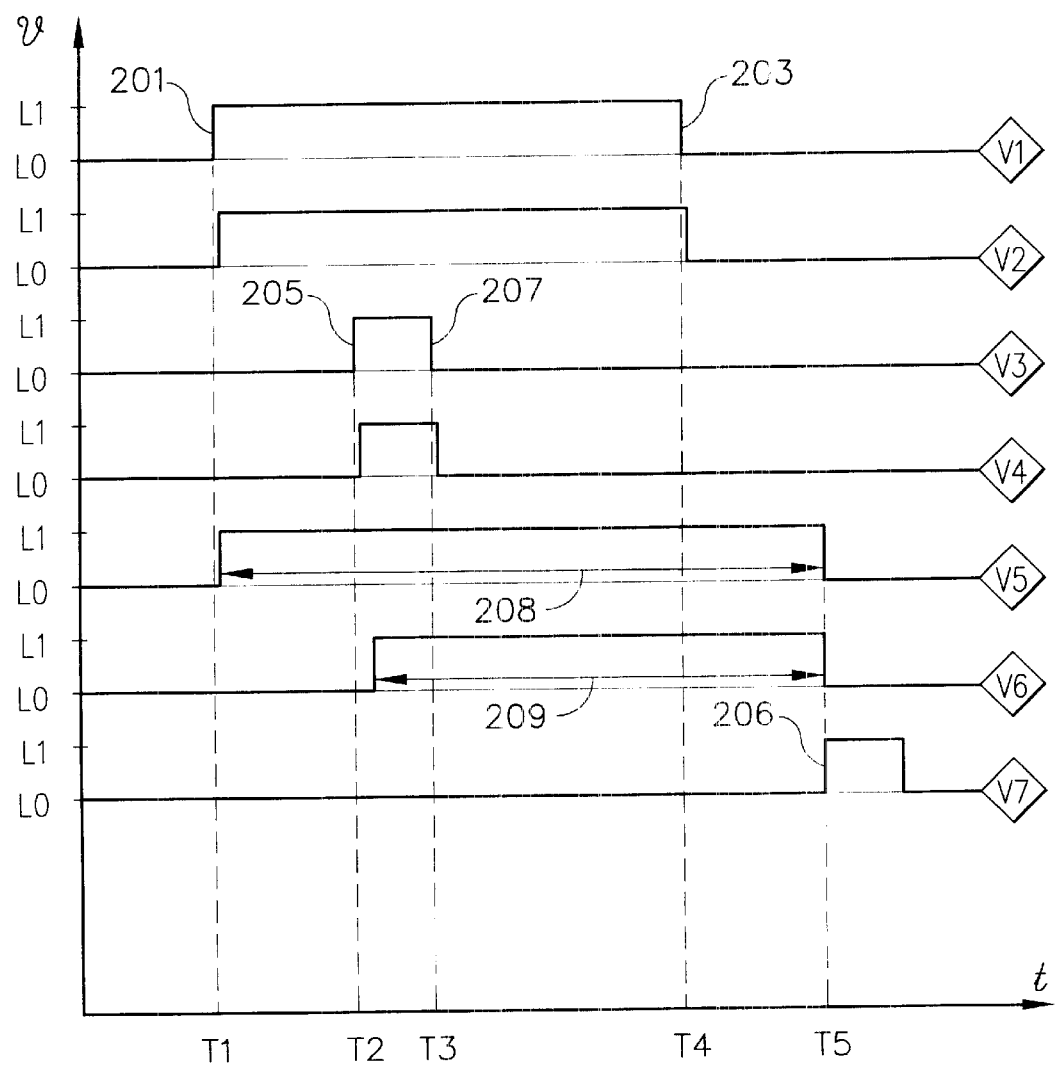
FIG. 9 is a timing diagram of some of the signals that appear on FIG. 8.

Referring now to FIG. 9, the waveforms of V1 through V7 are depicted on a timing diagram, in which the voltage level is the Y-axis, while time is the X-axis. At the moment in time T1, the output of the decoder chip 202 transitions from Logic 0 to Logic 1. Very shortly after that, the output of the AND-gate 220 will transition (as per the waveform V2) if the address counters are essentially synchronized. This begins the synchronization window (or tolerance), which is designated by the reference numeral 208 on FIG. 9, and represents the time between the positive-going and negative-going transitions of the waveform V5.

The output voltage of the decoder chip 204 is the signal V3, which makes a positive transition at 205, which corresponds to the time mark T2. Shortly after that, the waveform V4 will make a positive transition, if the Feedback Counters are within an appropriate but finer synchronization between the two SSCG modules. The output of the decoder chip 204 will fall back to Logic 0 at the time mark T3, which is shown on the negative-going transition 207 of V3. The waveform V4 will also make a negative-going transition shortly after that.

The output of the flip-flop 232 will make a positive transition shortly after the time interval T2, which is shown at the rising edge 209 of the time interval for the waveform V6 on FIG. 9. At a later time, the output voltage of the decoder chip 202 will fall to Logic 0 at the time mark T4, which is the falling transition at 203 for the waveform V1 on FIG. 9. Even though both decoder outputs have fallen to Logic 0, as well as their respective AND-gate outputs at V2 and V4, the flip-flops maintain the Logic 1 states for the voltage signals V5 and V6 for the time being. After the controller circuit makes its inspection of the logic states for the signals, it issues a reset, or this reset comes from the overflow bit of the Address Counter in the second SSCG module 11. This occurs at the time mark T5, and is exhibited at the rising edge 206 for the voltage V7 on FIG. 9. At that time, the flip-flops are reset, and their output signals fall to Logic 0.

Figure 10:
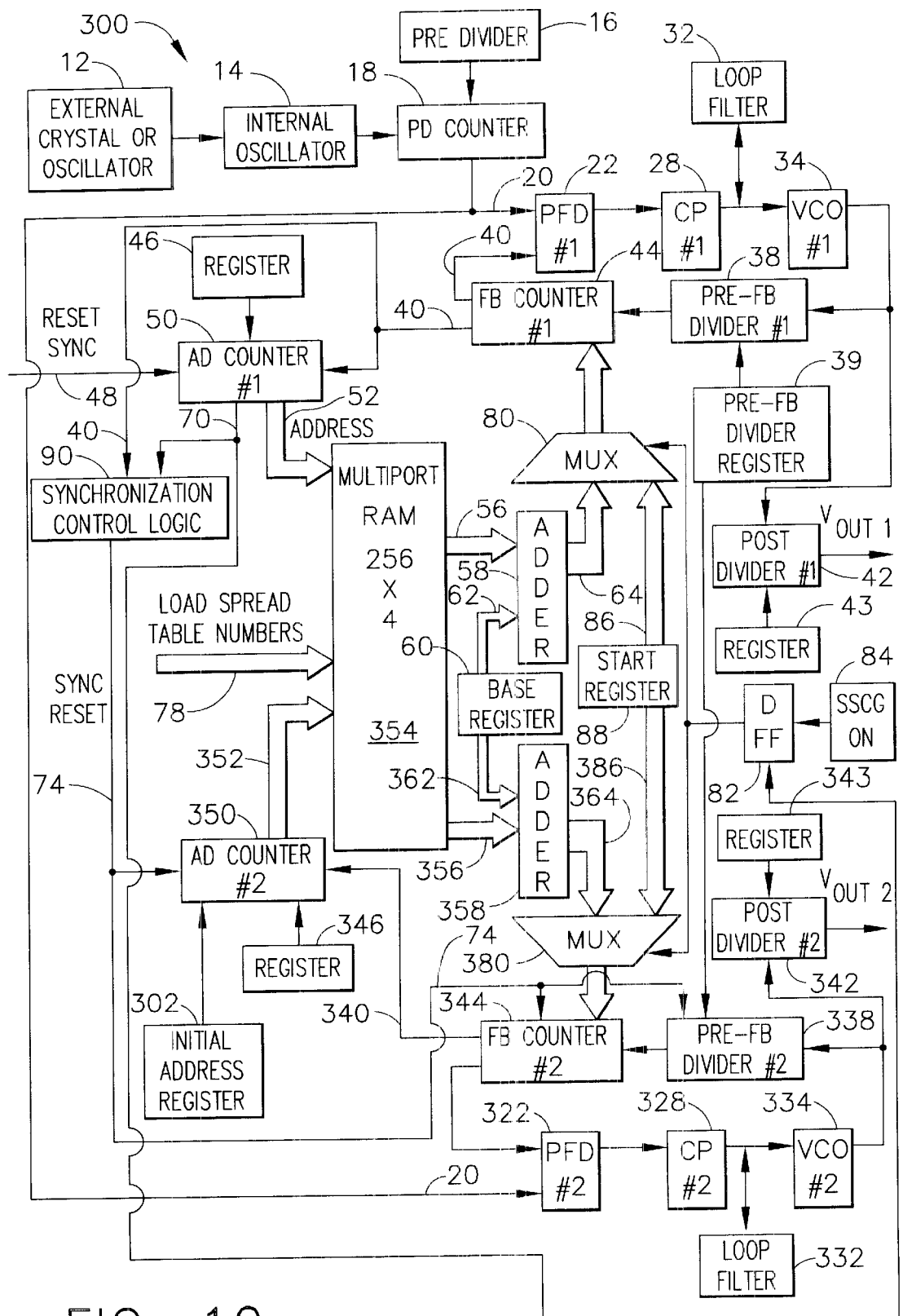
FIG. 10 is a block diagram of two spread spectrum clock generator circuits that share certain components, constructed according to the principles of the present invention.

As noted above, the dual spread spectrum clock generator circuits 10, 11 can potentially share certain components if they are both constructed on the same substrate of a logic chip, or of an ASIC, for example. FIG. 10 illustrates some of the circuitry for such an arrangement. In FIG. 10, a "shared component" dual SSCG clock circuit is generally designated by the reference numeral 300. This circuit includes most of the components illustrated on FIG. 1, including an oscillator 12, an internal oscillator 14, a pre-divider register 16, and a PD Counter 18. The output of the PD Counter 18 is represented at 20, and drives into the phase/frequency detector #1 (PFD #1) at 22.

The output of PFD #1 drives a charge pump #1 at 28, and this signal is shaped by a loop filter #1 at 32, and drives into a VCO #1 at 34. The output of VCO #1 drives a post-divider #1 circuit 42, which then outputs the first frequency clock signal at $V_{OUT1}$. The divider value for the post-divider #1 is provided by a register 43.

The output of VCO #1 also drives a pre-feedback divider #1 at 38, which then drives a Feedback Counter #1 at 44. The overflow or carry bit output at 40 from the Feedback Counter #1 drives the PFD #1, and also the Address Counter #1 at 50. This signal 40 can also drive the synchronization control logic 90, as illustrated on FIG. 10.

Address Counter #1 has a programmable register 46, and outputs an overflow bit at 70, as well as an address count value at a bus 52. Address Counter #1 also has an input at 48 referred to as the "Reset Sync" input. The overflow or rollover bit at 70 drives the synchronization control logic 90, and also drives the D flip-flop 82. A signal, or a hardware switch, referred to as the "SSCG ON signal" is provided at 84, which also drives the D flip-flop 82. Most of the components described so far in reference to FIG. 10 are exclusively used by the first SSCG module. However, the SSCG ON signal at 84 is used to drive two different multiplexers, a first multiplexer 80 that is part of the first SSCG module, and also a second multiplexer 380 that is used in the second SSCG module. Many of the other components on FIG. 10 will also have a shared capacity. For example, the pre-feedback divider register 39 provides a signal for both the pre-feedback divider #1 (at 38) as well as a pre-feedback divider #2 at 338. This register value would typically be identical for both pre-feedback divider circuits, especially in instances where the spread spectrum profile was to completely overlap in the frequency range, as well as to have an identical profile that is spaced-apart in time or phase.

To finish explaining the operation of the first SSCG module on FIG. 10, a multiport RAM device 354 will be now described, which is used by both the Address Counter #1 at 50 and by an Address Counter #2 at 350. This multiport RAM 354 can be used when the spread spectrum profiles are to have a full overlap and the clocks for both SSCG modules are to run at the same average frequency, and also if the spread spectrum profiles are identical. There will be two individual address buses 52 and 352 as inputs to this multiport RAM chip, and two individual data buses out at 56 and 356. In the illustrated embodiment of FIG. 10, multiport RAM chip 354 is a 256×4 device.

As in FIG. 1, the spread spectrum table numbers can be loaded from a microprocessor or other controller along a bus 78. These numbers would be utilized by both spread spectrum clock generator modules in a situation of full overlap and identical average operating frequency and profile. For the first SSCG module, the data bus out is the bus 56, which drives an adder circuit 58, which is also driven by a bus 62 provided from a Base Register 60. The output of the adder 58 is another bus 64 that drives into the multiplexer 80. A Start Register 88 also provides a numeric value along a bus 86 that drives the same multiplexer 80. These devices operate in a similar manner to those same elements described in reference to FIG. 1.

The second SSCG module uses its own Address Counter #2 at 350, which has its own register at 346, and outputs numbers along a separate address bus at 352 into the multiport RAM device 354. The register 346 is also a "table-length" register, similar to that of the register 46. A second data bus 356 is output from the multiport RAM device 354, which drives a second adder circuit 358, which is also driven along a second bus 362 from the common Base Register 60. The output of the adder circuit 358 is a numeric value send along a bus 364 to a multiplexer 380. This multiplexer 380 is also driven by a numeric value along a bus 386 from the common Start Register 88.

A second phase locked loop is used for the second SSCG module, and the main components of this second phase locked loop are a phase/frequency detector #2 at 322, a charge pump #2 at 328, a second loop filter at 332, a VCO #2 at 334, a post-divider #2 at 342, and a post-divider register at 343. The clock output is derived from the post-divider #2, and is designated as $V_{OUT2}$.

The output of VCO #2 is directed to the pre-divider #2 at 338, which in turn drives a Feedback Counter #2 at 344. The output of Feedback Counter #2 is the signal 340, which drives both the PFD #2 at 322 and the Address Counter #2 at 350.

The "Sync Reset" signal at 74 is the output signal from the synchronization control logic 90, and drives the Address Counter #2 at 350, the Feedback Counter #2 at 344, and also the pre-feedback divider #2 at 338. As discussed above, the pre-feedback divider #2 is also driven by the pre-feedback divider register 39. Finally, the fixed-frequency clock signal 20 also drives the PFD #2 322, in the same manner as it drives the PFD #1 at 22.

Address Counter #2 at 350 can also have a separate input from an initial address register 302. This can be used to start the second SSCG module at a different location in the spread spectrum profile, in which the Sync Reset signal 74 would be output virtually at the same time as the beginning moment of the spread spectrum profile for the first clock module. This would automatically cause the second SSCG clock module to start at a different location in the spread spectrum profile, which preferably would be either 18%, 50%, or 82% of the spread spectrum profile.

The common elements in FIG. 10 can now be identified as including the fixed-frequency components in the upper left-hand corner of FIG. 10, and the "middle" components that include the multiport RAM device 354, Base Register 60, Start Register 88, pre-feedback divider register 39, as well as the "start" components at 82 and 84.

Of course, any of these "shared" components could be split into two separate individual components, if desired by the circuit designer. If the output frequencies of the two SSCG modules are to have a different average value, then some of the shared components may have to be split out between the two SSCG modules. This would particularly be true if the spread spectrum profile for one clock module was different in shape as compared to the other clock module. The actual shape of the profiles will preferably be the shape that is described in U.S. Pat. No. 5,488,627, commonly assigned to Lexmark International, Inc., and which is incorporated herein by reference in its entirety.

Figure 11:
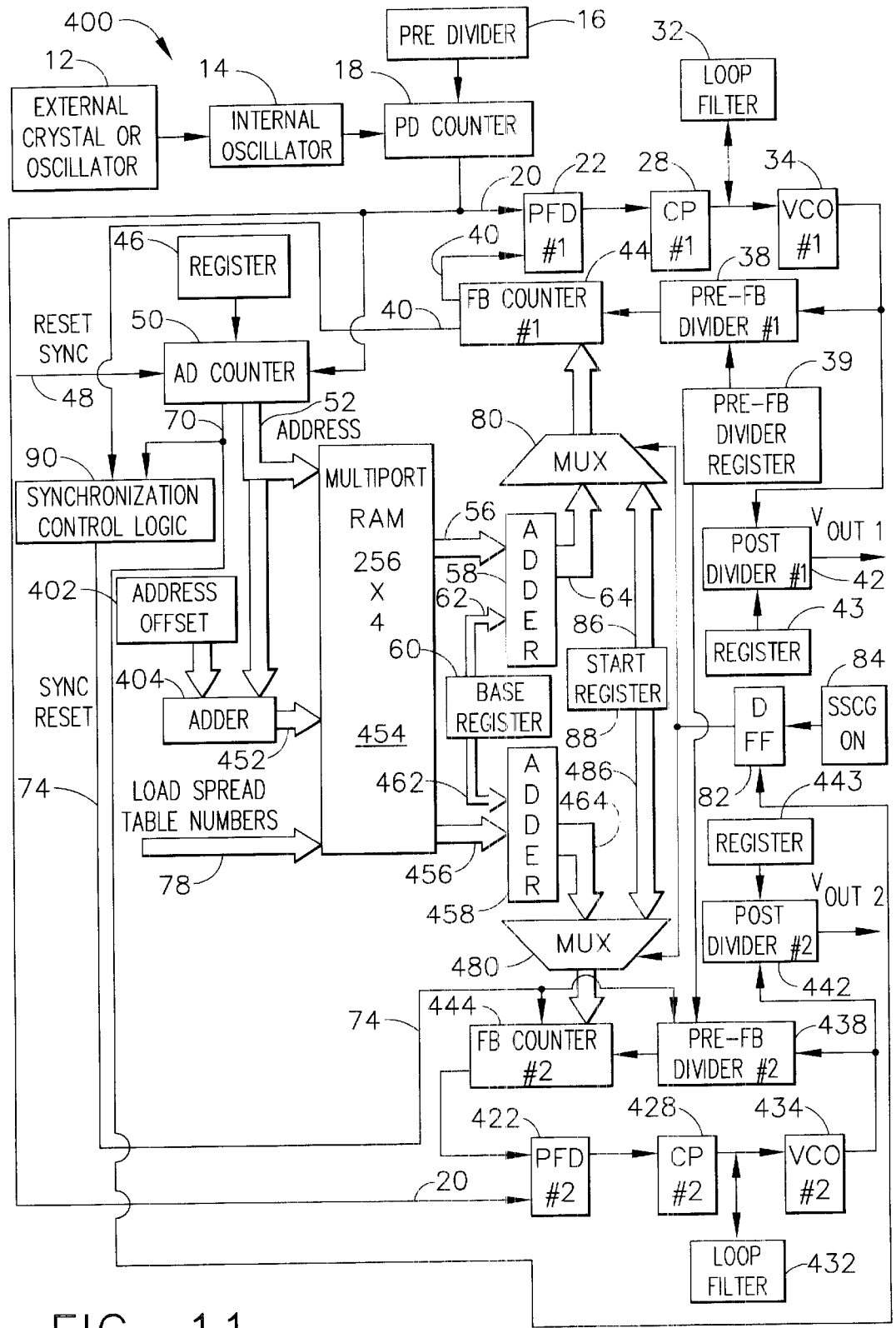
FIG. 11 is a block diagram of a second design of shared components for two spread spectrum clock generator circuits, constructed according to the principles of the present invention.

FIG. 11 depicts a second topography as the reference numeral 400 for sharing components between two different SSCG modules, and is a slight modification as compared to FIG. 10 in that only one Address Counter is necessary. Instead of clocking the Address Counter with the output from the Feedback Counter, the reference frequency input is utilized. The address value output from Address Counter 50 is sent along the address bus 52 not only to the multiport RAM 454, but also to an adder circuit 404. This adder circuit 404 adds an address offset to the Address Counter address, using a modulo maximum table address operation. The actual address offset is provided by a register 402.

The output from the adder 404 is sent along an address bus 454 into the multiport RAM 454. This will address the slave (i.e., the second SSCG module) phase locked loop profile table values. In this circuit topography, the spread spectrum profiles of both clock outputs would have to be identical, as well as the average output frequency.

The same components for the first clock module of FIG. 10 are also found in FIG. 11. This includes certain shared components, including the external oscillator 12, internal oscillator 14, pre-divider 16, and PD Counter 18, which outputs a fixed-frequency clock signal at 20. Other shared components include the multiport RAM 454, Base Register 60, Start Register 88, pre-feedback divider register 39, the D flip-flop 82 and its associated SSCG ON signal 84.

The first clock module includes the standard phase locked loop components described earlier in reference to FIG. 10, and the output signal is referred to as $V_{OUT1}$. The same adder 58 is used along with a multiplexer 80 to drive the Feedback Counter #1 at 44. In this circuit of FIG. 11, the Address Counter 50 and associated "table size" register 46 are also common components for both SSCG modules. This is also true for the data values that are loaded into the multiport RAM along the data bus 78, as performed by a controlling device such as a microprocessor or logic state machine.

A Reset Sync input at 48 also drives the Address Counter 50, and the overflow (or rollover) bit 70 from the Address Counter 50 drives the D flip-flop 82 and into the synchronization control logic 90. The output from the synchronization control logic is the signal 74 referred to as Sync Reset, which drives the Feedback Counter #2 at 444 and a pre-feedback divider #2 at 438.

The main components of the second module are virtually the same as described on FIG. 10, keeping in mind that there is no separate Address Counter for the second module on FIG. 11. However, the remaining phase locked loop components separately exist, including a phase/frequency detector #2 at 422, a charge pump #2 at 428, a second loop filter 432, a VCO #2 at 434, a post-divider #2 at 444, and its associated register at 443. A data bus 456 drives a second adder circuit at 458, which also has an input from the Base Register 60 along a data bus 462. The output of the adder circuit 458 is directed along a bus 464 into a second multiplexer 480, which drives the Feedback Counter #2. The Start Register 88 also drives a value along a bus 486 into the multiplexer 480.

Figure 12:
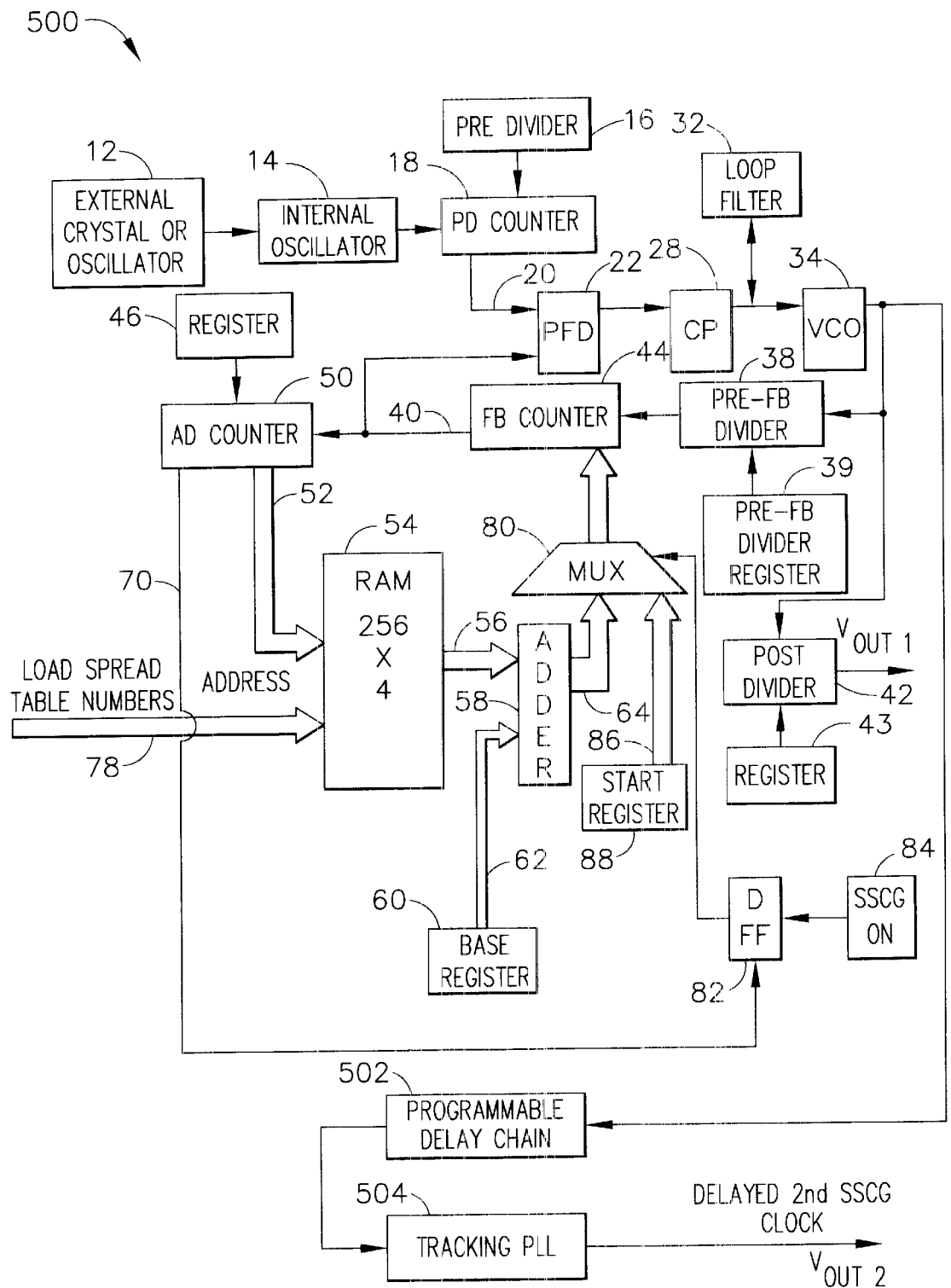
FIG. 12 is a block diagram of a spread spectrum clock generator circuit that utilizes a tracking phase locked loop to create a second spread spectrum clock generator output having the same spread spectrum profile, constructed according to the principles of the present invention.

A further method for creating a pair of spread spectrum clock generators that operate at the same average frequency and have the same profile is to use a programmable delay chain and a tracking phase locked loop, as illustrated on FIG. 12. This is referred to as a circuit 500, which includes the normal spread spectrum clock generator components that were described in reference to FIG. 1, except for the synchronization control logic 90. Instead of this synchronization logic, a programmable delay chain 502 is provided that delays the clock signal by a predetermined amount, and drives it into a tracking phase locked loop circuit 504. The output of this tracking phase locked loop circuit is a delayed imitation of the output from the VCO at 34, and this delayed output is referred to as $V_{OUT2}$. The programmable delay chain can introduce a phase difference between the two clock outputs, and if the modulation period of the master phase locked loop was thirty-one microseconds, then an 18% phase difference between the master and slave clocks will correspond to a delay of 5.58 microseconds. The delay chain would then be programmed to provide this delay, or any other delay that is deemed most beneficial. This removes the need for a second programmable phase locked loop and for the synchronization logic itself.

It will be understood that the tracking phase locked loop will require a relatively high bandwidth so it tracks the fidelity of the input signal. Of course, this input signal is a substantially constantly changing frequency clock signal, which is the essence of a spread spectrum clock generator circuit.

It also will be understood that the requirement for synchronizing two different spread spectrum clock generator modules could be met by synchronizing only the very first cycle upon initialization, because these digital clocks would stay in synchronization forever once they begin operating, particularly if they are running at the same average frequency and use the same profile. Alternatively, there could be two different modulation frequencies, and a re-synchronizing operation could be performed upon each modulation cycle to keep such clocks in synchronization. Furthermore, a partial overlap of clock frequencies may require a different preferred phase angle between modulation profiles that is other than 18% or 50% or 82%, as described above for the preferred embodiments described above.

Figure 13:
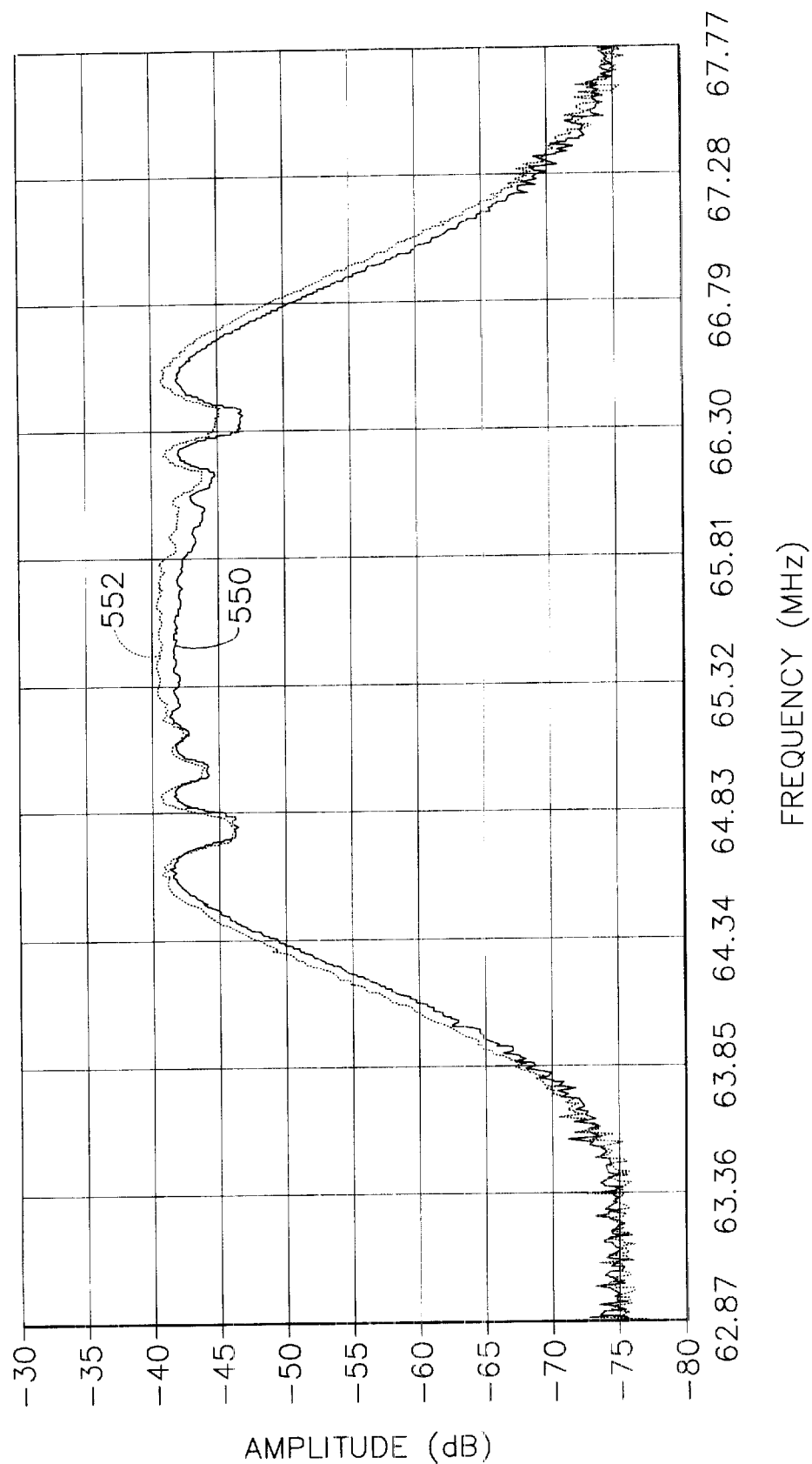
FIG. 13 is a graph of the frequency spectrum of two separate spread spectrum clock generator circuits, utilizing the present invention.

FIG. 13 is a graph that shows the individual spectra of two different spread spectrum clock generator circuits, as plotted in amplitude versus frequency. The first module is illustrated along the curve 550, while the output of the second module is illustrated along the curve 552. These two clock signals exhibit a separation of about 1 dB in this example, although in reality they could be emitting precisely the same amplitudes if they were both generated by the same chip under the same conditions.

Figure 14:
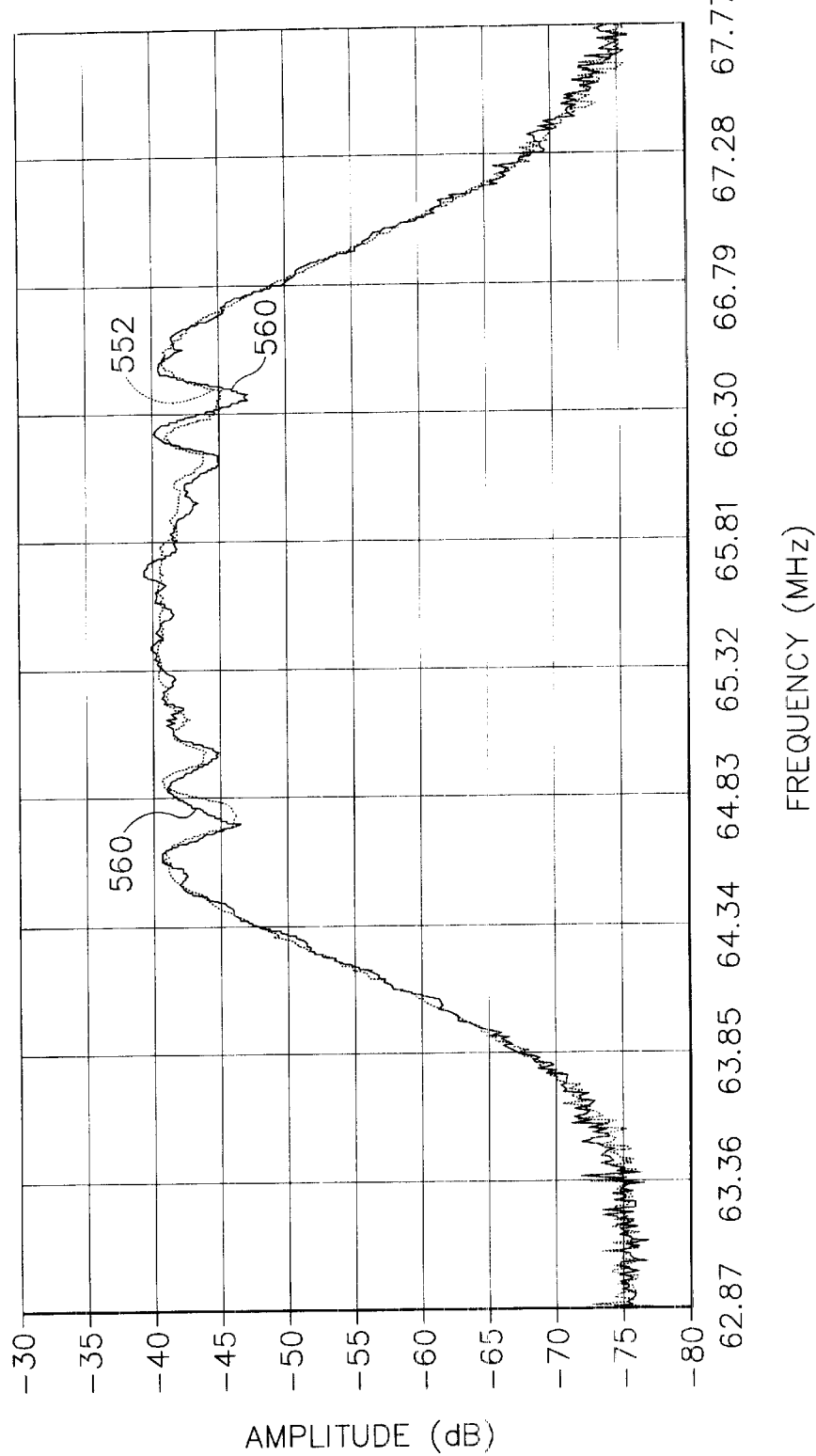
FIG. 14 is a graph showing the emissions of one spread spectrum clock generator circuit as compared to a combined emission of two separate spread spectrum clock generator circuits that exhibit a phase difference of 18%, utilizing the present invention.

FIG. 14 is a graph showing the frequency spectrum of the second clock module at 552 in comparison with the overall emissions in a frequency spectrum for both modules, when there is an 18% phase difference between these modules. The total emission is depicted at the curve 560, and it can be seen that this curve is definitely much less than 6 dB above the emissions for the second module alone at 552. This graphically illustrates the primary advantage of the present invention, in that two completely overlapping spread spectrum clocks can be utilized and driven from a single fixed-frequency source, while not necessarily increasing the overall emissions.

Figure 15:
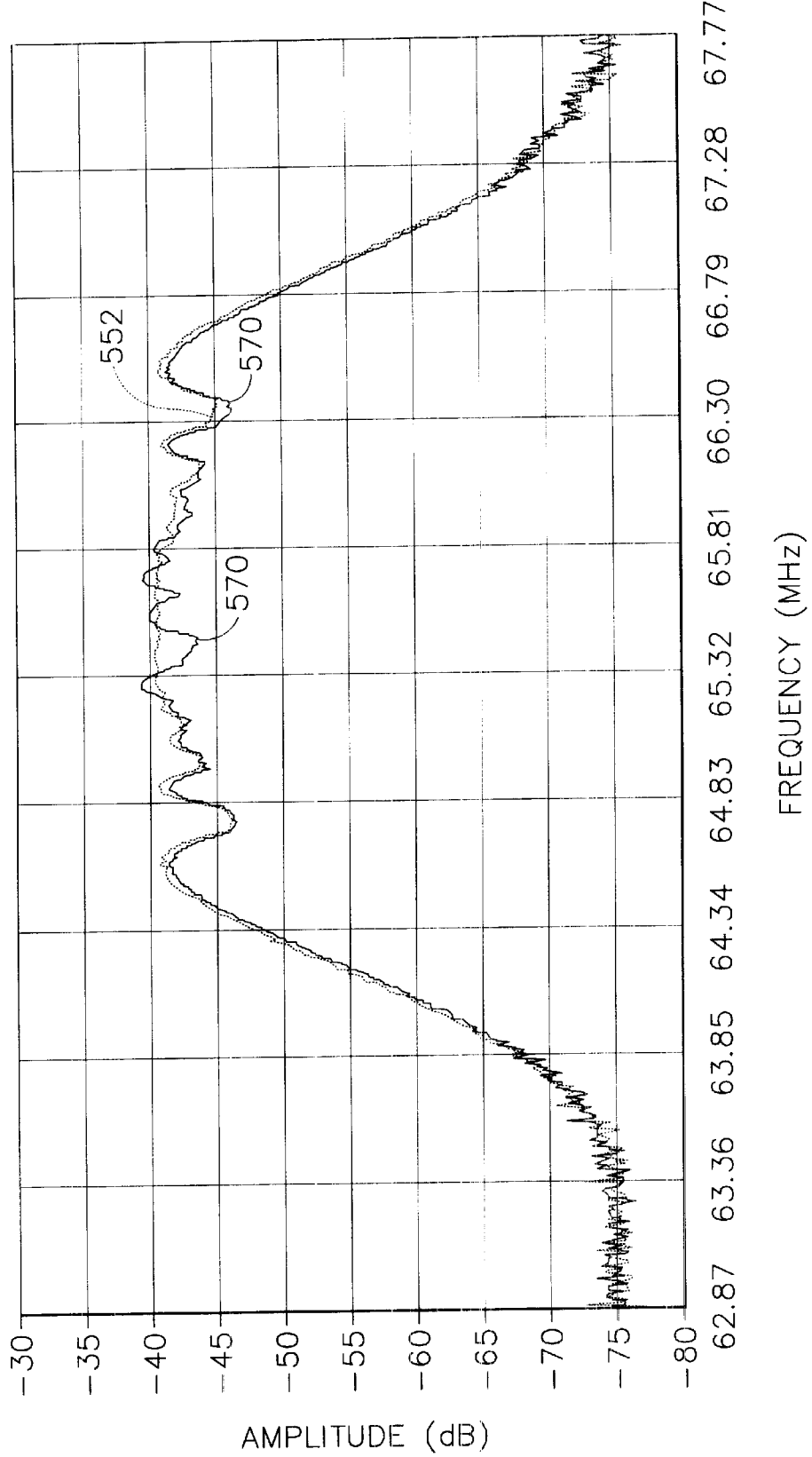
FIG. 15 is a graph showing the emissions of one spread spectrum clock generator circuit as compared to a combined emission of two separate spread spectrum clock generator circuits that exhibit a phase difference of 50%, utilizing the present invention.

FIG. 15 graphically shows the result when two clock modules are separated by a 50% phase difference, which is represented by the curve 570. For comparison, the curve 552 is also illustrated, which represents the emissions produced by the second module alone. Again, it can be seen that the overall emissions are much less than 6 dB above the single clock output of the second module.

Figure 16:
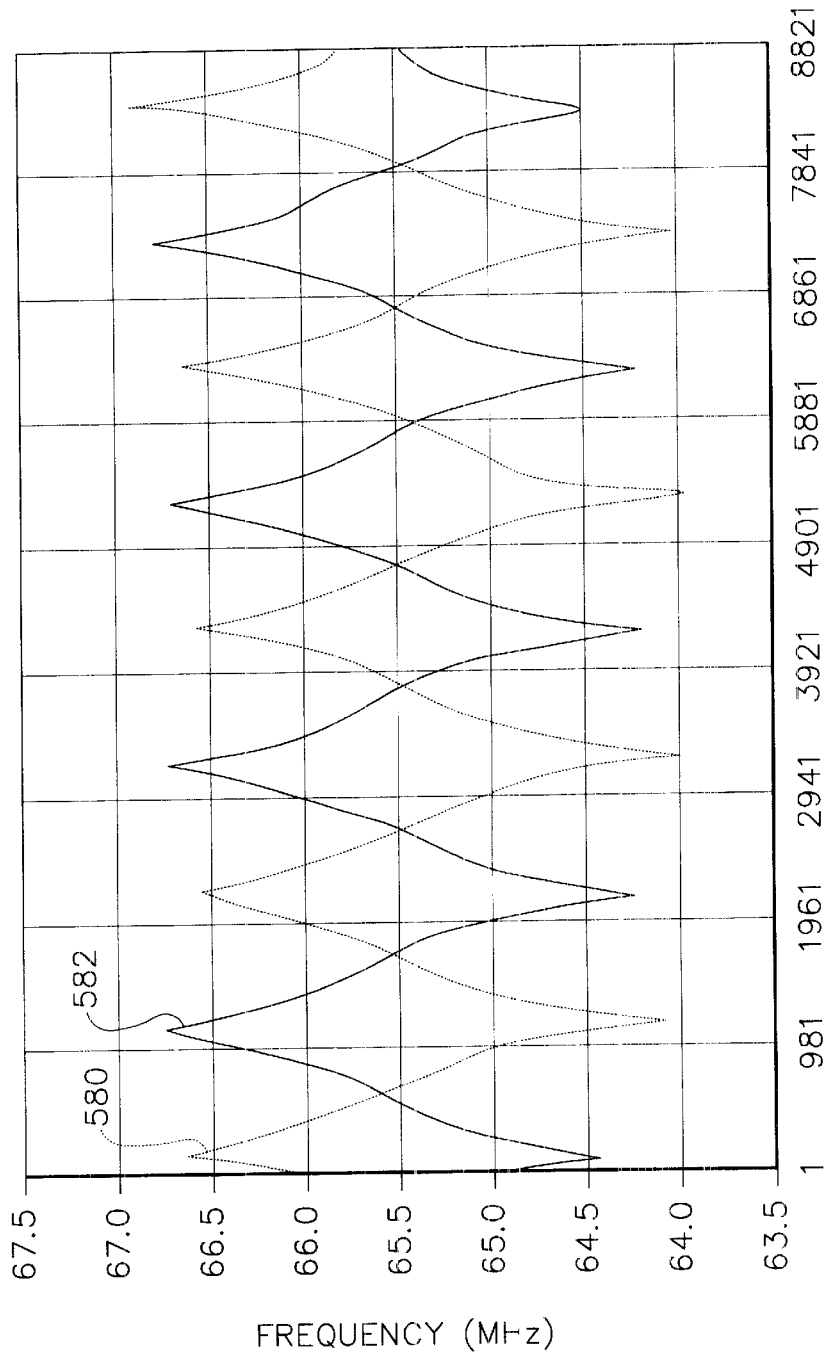
FIG. 16 is a graph showing the output frequencies over time of two different spread spectrum clock generator circuits that have a phase difference of 50%, utilizing the present invention.

FIG. 16 is a graph showing two different spread spectrum clock generator circuits over time, utilizing the preferred spread spectrum profile. On FIG. 16, the two clocks are separated by a phase difference of about 50%. The first clock module produces a curve at 580, while the second clock module produces a curve at 582.

Figure 17:
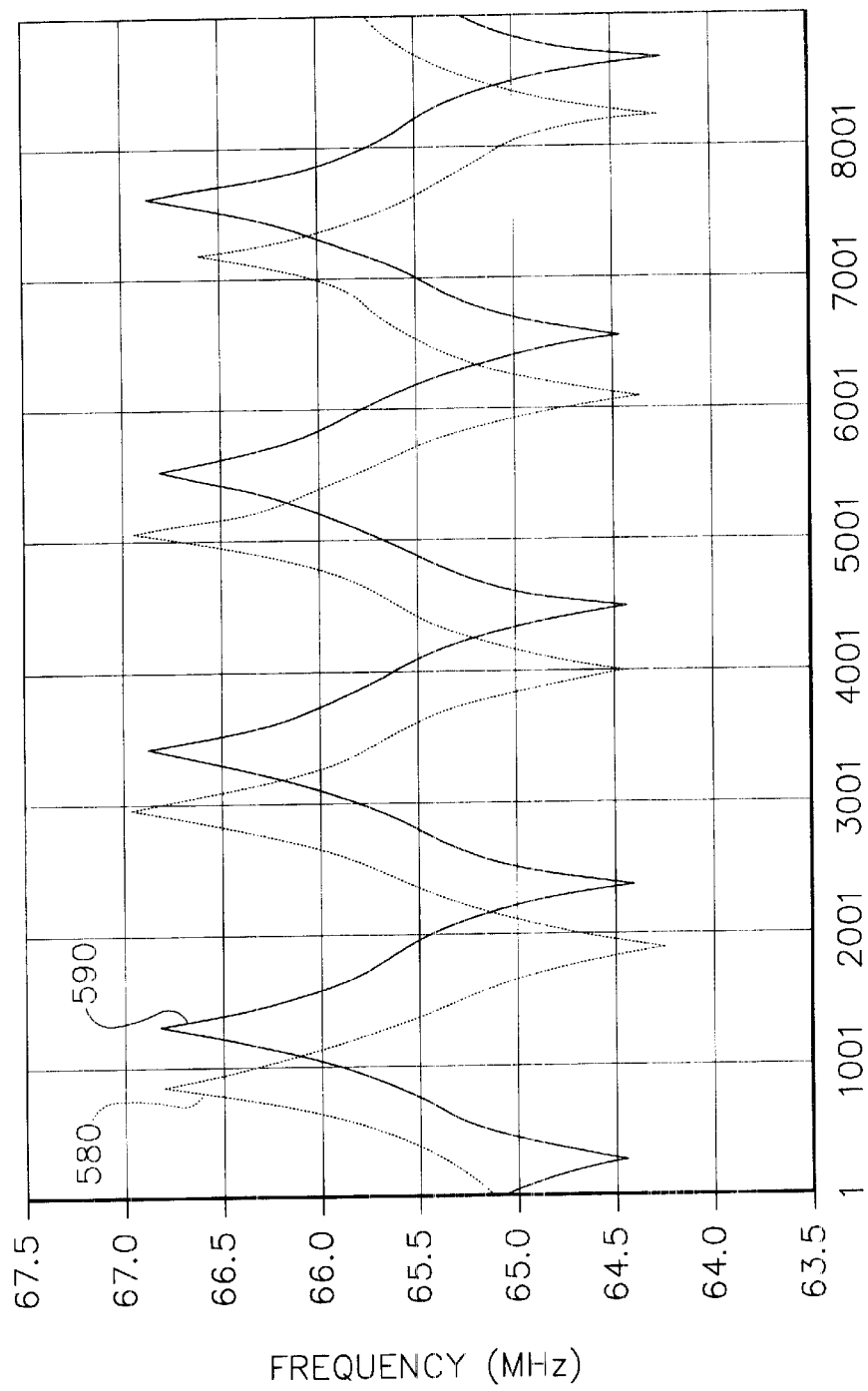
FIG. 17 is a graph showing the output frequencies over time of two different spread spectrum clock generator circuits that have a phase difference of 18%, utilizing the present invention.

FIG. 17 is a similar graph of two spread spectrum clock generators that completely overlap and have the same spread spectrum profile shape (which again exhibits the preferred shape). In this instance, the phase difference is about 18% between the two clock outputs. The first clock module has a curve at 580, while the second clock module produces a curve at 590.

It will be understood that the logical operations described in relation to controlling binary numbers or "values" on various buses depicted in the drawings can be implemented using sequential logic, such as by using microprocessor technology, or using a logic state machine, or perhaps by discrete logic. This is particularly true for the "spread table" values loaded over the bus 78 on FIGS. 1, 11, and 12. It will also be understood that the entire circuit that implements the present invention in its various embodiments could be contained within a single ASIC in the preferred mode of the present invention, although this is not a requirement by any means. Even a microprocessor or logic state machine could be included in the same, single ASIC, if desired.

It will be further understood that the precise circuit components and their logical operations depicted in the drawings, and discussed above, could be modified to perform similar, although not exact, functions without departing from the principles of the present invention. While the embodiments of the present invention may be used in ink jet printers or laser printers by the Assignee of the present invention, certainly other electronic products could certainly benefit by use of multiple spread spectrum clock generators as disclosed herein.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A method for controlling a plurality of spread spectrum clock generator circuits, said method comprising:
    (a) providing a first spread spectrum clock generator circuit and a second spread spectrum clock generator circuit, and providing a synchronization control logic circuit;
    (b) controlling said first spread spectrum clock generator circuit so that it outputs a first predetermined plurality of frequencies over a first predetermined time period, as according to a first predetermined spread spectrum profile;
    (c) controlling said second spread spectrum clock generator circuit so that it outputs a second predetermined plurality of frequencies over a second predetermined time period, as according to a second predetermined spread spectrum profile; and
    (d) further controlling said second spread spectrum clock generator circuit so that its second predetermined plurality of frequencies at least partially overlaps the first predetermined plurality of frequencies of said first spread spectrum clock generator circuit, while at the same time controlling a frequency difference between the outputs of both said first and second spread spectrum clock generator circuits so that an overall increase in electromagnetic emissions due to a combination of said first and second spread spectrum clock generator circuits is less than 6 dB above the electromagnetic emissions due solely to said first spread spectrum clock generator circuit.

2. The method as recited in claim 1, wherein the second predetermined plurality of frequencies of said second spread spectrum clock generator circuit substantially completely overlaps the first predetermined plurality of frequencies of said first spread spectrum clock generator circuit, and wherein said overall increase in electromagnetic emissions is reduced by controlling a starting frequency of said second predetermined spread spectrum profile so that it exhibits a predetermined difference from a starting frequency of said first predetermined spread spectrum profile.

3. The method as recited in claim 1, wherein the second predetermined plurality of frequencies of said second spread spectrum clock generator circuit substantially completely overlaps the first predetermined plurality of frequencies of said first spread spectrum clock generator circuit, and wherein said overall increase in electromagnetic emissions is reduced by controlling a starting time of said second predetermined spread spectrum profile so that the starting time exhibits a predetermined difference from a starting time of said first predetermined spread spectrum profile, although the starting frequencies of both first and second predetermined spread spectrum profiles are substantially identical.

4. The method as recited in claim 2, wherein after both said first and second spread spectrum clock generator circuits are running, a phase difference between said first and second predetermined spread spectrum profiles results, and represents substantially one of 18% or 50% of the spread spectrum profile period.

5. The method as recited in claim 3, wherein after both said first and second spread spectrum clock generator circuits are running, said predetermined difference between the first and second starting times results in a phase difference between said first and second predetermined spread spectrum profiles, and said phase difference represents substantially one of 18% or 50% of the spread spectrum profile period.

6. The method as recited in claim 1, wherein the second predetermined plurality of frequencies of said second spread spectrum clock generator circuit substantially completely overlaps the first predetermined plurality of frequencies of said first spread spectrum clock generator circuit, and a shape and period of said first predetermined spread spectrum profile is substantially identical to a shape and period of said second predetermined spread spectrum profile.

7. The method as recited in claim 1, further comprising: providing a synchronizing check circuit that generates a signal indicative as to whether or not said first and second spread spectrum clock generator circuits are correctly synchronized.

8. A multiple output spread spectrum clock generator circuit, comprising:
   a first spread spectrum clock generator circuit, and a second spread spectrum clock generator circuit; said first spread spectrum clock generator circuit outputting a first predetermined plurality of frequencies over a first predetermined time period, as according to a first predetermined spread spectrum profile; said second spread spectrum clock generator circuit outputting a second predetermined plurality of frequencies over a second predetermined time period, as according to a second predetermined spread spectrum profile, wherein the second predetermined plurality of frequencies of said second spread spectrum clock generator circuit at least partially overlaps the first predetermined plurality of frequencies of said first spread spectrum clock generator circuit; and
   a synchronization control logic circuit which controls in real time a frequency difference between the outputs of both said first and second spread spectrum clock generator circuits so that an overall increase in electromagnetic emissions due to a combination of said first and second spread spectrum clock generator circuits is less than 6 dB above the electromagnetic emissions due solely to said first spread spectrum clock generator circuit.

9. The multiple output spread spectrum clock generator circuit as recited in claim 8, wherein the second predetermined plurality of frequencies of said second spread spectrum clock generator circuit substantially completely overlaps the first predetermined plurality of frequencies of said first spread spectrum clock generator circuit, and wherein said overall increase in electromagnetic emissions is reduced by controlling a starting frequency of said second predetermined spread spectrum profile so that it exhibits a predetermined difference from a starting frequency of said first predetermined spread spectrum profile.

10. The multiple output spread spectrum clock generator circuit as recited in claim 8, wherein the second predetermined plurality of frequencies of said second spread spectrum clock generator circuit substantially completely overlaps the first predetermined plurality of frequencies of said first spread spectrum clock generator circuit, and wherein said overall increase in electromagnetic emissions is reduced by controlling a starting time of said second predetermined spread spectrum profile so that the starting time exhibits a predetermined difference from a starting time of said first predetermined spread spectrum profile, although the starting frequencies of both first and second predetermined spread spectrum profiles are substantially identical.

11. The multiple output spread spectrum clock generator circuit as recited in claim 9, wherein after both said first and second spread spectrum clock generator circuits are running, a phase difference between said first and second predetermined spread spectrum profiles results, and represents substantially one of 18% or 50% of the spread spectrum profile period.

12. The multiple output spread spectrum clock generator circuit as recited in claim 10, wherein after both said first and second spread spectrum clock generator circuits are running, said predetermined difference between the first and second starting times results in a phase difference between said first and second predetermined spread spectrum profiles, and said phase difference represents substantially one of 18% or 50% of the spread spectrum profile period.

13. The multiple output spread spectrum clock generator circuit as recited in claim 8, wherein the second predetermined plurality of frequencies of said second spectrum clock generator circuit substantially completely overlaps the first predetermined plurality of frequencies of said first spread spectrum clock generator circuit, and a shape and period of said first predetermined spread spectrum profile is substantially identical to a shape and period of said second predetermined spread spectrum profile.

14. The multiple output spread spectrum clock generator circuit as recited in claim 8, wherein said synchronization control logic comprises one of: (a) a first decoder circuit that outputs a reset signal to said second spread spectrum clock generator circuit when it receives a predetermined binary number from an Address Counter of said first spread spectrum clock generator circuit; (b) a second decoder circuit that outputs a second signal when it receives a predetermined binary number from an Address Counter of said first spread spectrum clock generator circuit, a third decoder circuit that outputs a third signal when it receives a predetermined binary number from a Feedback Counter of said first spread spectrum clock generator circuit, and at least one logic gate that receives said second and third signals and outputs a reset signal to said second spread spectrum clock generator circuit; or (c) a flip-flop circuit that receives a rollover signal from an Address Counter of said first spread spectrum clock generator circuit and outputs a fourth signal, a counter circuit that receives a rollover signal from a Feedback Counter of said first spread spectrum clock generator circuit and outputs a fifth signal, and at least one logic gate that receives said fourth and fifth signals and outputs a reset signal to said second spread spectrum clock generator circuit.

15. The multiple output spread spectrum clock generator circuit as recited in claim 14, further comprising: a delay chain and multiplexer circuit that provides a fine control adjustment to said reset signal before it is directed to said second spread spectrum clock generator circuit.

16. The multiple output spread spectrum clock generator circuit as recited in claim 8, further comprising: a synchronizing check circuit that generates a "sync check" signal indicative as to whether or not said first and second spread spectrum clock generator circuits are correctly synchronized.

17. The multiple output spread spectrum clock generator circuit as recited in claim 16, wherein said synchronizing check circuit comprises: a first decoder circuit that outputs a first signal when it receives a predetermined binary number from an Address Counter of said first spread spectrum clock generator circuit; a second decoder circuit that outputs a second signal when it receives a predetermined binary number from a Feedback Counter of said first spread spectrum clock generator circuit; a third decoder circuit that outputs a third signal when it receives a predetermined binary number from an Address Counter of said second spread spectrum clock generator circuit; a fourth decoder circuit that outputs a fourth signal when it receives a predetermined binary number from a Feedback Counter of said second spread spectrum clock generator circuit; a "course sync" logic circuit that receives said first and third signals and outputs a fifth signal; a "fine sync" logic circuit that receives said second and fourth signals and outputs a sixth signal; and an output stage logic circuit that receives said fifth and sixth signals and outputs said "sync check" signal.

18. The multiple output spread spectrum clock generator circuit as recited in claim 8, wherein some of the circuit components are shared between both said first and second spread spectrum clock generator circuits.

19. The multiple output spread spectrum clock generator circuit as recited in claim 18, wherein said shared circuit components include: an input clock oscillator, a Base Register, a Start Register, a multiport RAM device, and an "ON" signal circuit; and further comprising:
an initial address register that loads a binary number into an Address Counter of said second spread spectrum clock generator circuit.

20. The multiple output spread spectrum clock generator circuit as recited in claim 18, wherein said shared circuit components include: an input clock oscillator, a Base Register, a Start Register, an Address Counter, a multiport RAM device, and an "ON" signal circuit; and further comprising an address offset register and adder circuit that loads an offset address binary number into said multiport RAM device.

21. The multiple output spread spectrum clock generator circuit as recited in claim 8, further comprising: a third spread spectrum clock generator circuit which outputs a third predetermined plurality of frequencies over a third predetermined time period, as according to a third predetermined spread spectrum profile, wherein the third predetermined plurality of frequencies of said third spread spectrum clock generator circuit at least partially overlaps the second predetermined plurality of frequencies of said second spread spectrum clock generator circuit; and wherein said synchronization control logic circuit is further configured to control in real time a frequency difference between the outputs of said first, second, and third spread spectrum clock generator circuits so that an overall increase in electromagnetic emissions due to a combination of said first, second, and third spread spectrum clock generator circuits is less than 9.5 dB above the electromagnetic emissions due solely to said first spread spectrum clock generator circuit.

22. A multiple output spread spectrum clock generator circuit, comprising:
a first spread spectrum clock generator circuit, and a second spread spectrum clock generator circuit; said first spread spectrum clock generator circuit outputting a first predetermined plurality of frequencies over a first predetermined time period, as according to a first predetermined spread spectrum profile; said second spread spectrum clock generator circuit outputting a second predetermined plurality of frequencies over a second predetermined time period, as according to a second predetermined spread spectrum profile, wherein the second predetermined plurality of frequencies of said second spread spectrum clock generator circuit at least partially overlaps the first predetermined plurality of frequencies of said first spread spectrum clock generator circuit; and wherein said first spread spectrum clock generator circuit comprises a frequency synthesizer circuit, said second spread spectrum clock generator circuit comprises a programmable delay chain circuit and a tracking phase locked loop circuit, and said programmable delay chain circuit provides a temporal difference in real time between the outputs of both said first and second spread spectrum clock generator circuits so that an overall increase in electromagnetic emissions due to a combination of said first and second spread spectrum clock generator circuits is less than 6 dB above the electromagnetic emissions due solely to said first spread spectrum clock generator circuit.

* * * * *